(12) United States Patent  
Nishimura et al.

(10) Patent No.: US 7,973,404 B2  
(45) Date of Patent: Jul. 5, 2011

(54) RELAY BOARD PROVIDED IN SEMICONDUCTOR DEVICE, SEMICONDUCTOR DEVICE, AND MANUFACTURING METHOD OF SEMICONDUCTOR DEVICE

(75) Inventors: Takao Nishimura, Kawasaki (JP); Yoshiaki Narisawa, Kawasaki (JP); Yoshikazu Kumagaya, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 436 days.

(21) Appl. No.: 11/377,393

(22) Filed: Mar. 17, 2006

(65) Prior Publication Data

US 2007/0132102 A1 Jun. 14, 2007

(30) Foreign Application Priority Data

Dec. 8, 2005 (JP) ................................. 2005-354986

(51) Int. Cl.  
*H01L 23/34* (2006.01)
(52) U.S. Cl. .................. 257/723; 257/724; 438/107
(58) Field of Classification Search .................. 257/698, 257/701, 686, 723, 724, 777; 438/118, 119, 438/125, 110, 107  
See application file for complete search history.

(56) References Cited

U.S. PATENT DOCUMENTS

| 6,469,393 | B2* | 10/2002 | Oya | 257/779 |
| 7,294,922 | B2* | 11/2007 | Jobetto et al. | 257/700 |
| 7,405,486 | B2 | 7/2008 | Kato | |
| 2001/0054753 | A1 | 12/2001 | Oya | |
| 2005/0168961 | A1* | 8/2005 | Ono et al. | 361/784 |
| 2007/0075437 | A1* | 4/2007 | Nishimura et al. | 257/778 |

FOREIGN PATENT DOCUMENTS

| JP | 2001-7278 | | 1/2001 |
| JP | 2002-76250 | | 3/2002 |
| JP | 2002-261234 | | 9/2002 |
| JP | 2004-235352 | | 8/2004 |
| JP | 2005-244164 | A | 9/2005 |
| JP | 2005-277356 | A | 10/2005 |

OTHER PUBLICATIONS

Korean Office Action dated May 28, 2007 issued in corresponding Application No. 10-2006-0031858.  
Taiwanese Office Action dated Nov. 24, 2008, issued in corresponding Taiwanese Patent Application No. 095109161.  
Japanese Office Action dated Nov. 24, 2010, issued in corresponding Japanese Patent Application No. 2005-354986.

* cited by examiner

*Primary Examiner* — S. V Clark  
(74) *Attorney, Agent, or Firm* — Westerman, Hattori, Daniels & Adrian, LLP

(57) ABSTRACT

A relay board provided in a semiconductor device, including an entire main surface that is made of a conductive material. The relay board may further include a substrate made of the same material as at least one semiconductor element provided in the semiconductor device. The main surface of the relay board may be formed at an upper part of the substrate.

14 Claims, 38 Drawing Sheets

4

RELAY BOARD PROVIDED IN SEMICONDUCTOR DEVICE, SEMICONDUCTOR DEVICE, AND MANUFACTURING METHOD OF SEMICONDUCTOR DEVICE

BACKGROUND OF THE INVENTION

1. Field of the Invention

The present invention generally relates to relay boards provided in semiconductor devices, semiconductor devices, and manufacturing methods of semiconductor devices, and more specifically, to a relay board used for wiring the semiconductor chips to each other, or the semiconductor chip to and a wiring board or a lead frame, a semiconductor device having the relay board, and a manufacturing method of the semiconductor device.

2. Description of the Related Art

A chip stack type (stacked package) semiconductor device having a structure where semiconductor chips (semiconductor elements) of different functions are stacked on a die pad of a lead frame or a wiring board, and electrode pads of the semiconductor chips and a bonding pad on the wiring board or an inner lead of the lead frame or the electrode pads of the semiconductor chips are wired by bonding wires, is known.

In such a semiconductor device, depending on arrangements of electrode pads of the semiconductor chip and bonding pads of the wiring substrate or a bonding lead of the lead frame, or arrangements of plural stacked semiconductor devices, crossing or superposing of the bonding wires happens, the length of the bonding wire is too long, or the like so that wire-bonding may be hard to accomplish.

In order to solve such a problem, a relay board having a wire and a terminal formed on an end part of the wire has been suggested. More specifically, a structure where the semiconductor chip and the wiring board or the inner lead of the lead frame, or the electrode pads of the semiconductor chips are electrically connected by wire bonding via the relay board has been suggested.

For example, a structure where a wiring sheet having a wiring pattern and a terminal formed at an end part of the wiring pattern is provided between plural semiconductor chips is discussed in Japanese Laid-Open Patent Application Publication No. 2001-7278. A structure where a wiring layer for relay-wiring a wire for wire bonding is provided between plural semiconductor chips stacked on a board is discussed in Japanese Laid-Open Patent Application Publication No. 2002-76250. A structure where a rearranging sheet having an insulation sheet and plural conductive metal patterns formed on the insulation sheet is provided between plural semiconductor chips stacked on a board is discussed in Japanese Laid-Open Patent Application Publication No. 2002-261234. A structure where an interposer having a connection wire is provided between plural semiconductor chips stacked on a board is discussed in Japanese Laid-Open Patent Application Publication No. 2004-235352.

However, while sizes of the semiconductor chip and the wiring board and the number and the arrangement of the bonding pads formed on the wiring board or the electrode pads formed on the semiconductor chip are varied, designated wiring patterns and terminals are formed in the relay board in the related art discussed in the above-mentioned publications.

Accordingly, even if a terminal chip is proper for the design of a certain semiconductor device, the terminal chip may not always be proper for the design of other semiconductor devices. In other words, for every semiconductor device, the wiring pattern and the terminal are formed on the relay board as corresponding to the arrangement of the electrode of the semiconductor chip and the arrangement of the bonding pad of the wiring board or the lead frame.

Therefore, depending on the positional relationship between the semiconductor chip and the lead frame or the pad of the wiring board, the related art relay boards may not be used and therefore the relay boards have to be redesigned and remanufactured. Thus, the related art relay board may not be widely used.

The way of mounting a semiconductor chip on a semiconductor device, the arrangement of electrode pads of a semiconductor chip, or the connection structure between a semiconductor chip and a wiring board or a lead frame may need to be changed. In addition, for the purpose of improvement of yield in manufacturing existing semiconductor devices, positions of the bonding pads of the relay boards may need to be changed. The related art relay boards do not correspond to these structures and it is necessary to provide a relay board having a different structure.

Furthermore, the wiring patters of the related art relay boards are formed by using a photolithography technique. Hence, in the related art, a manufacturing cost for manufacturing the relay board and the semiconductor device having the relay board is high.

In addition, when the relay board is provided between the semiconductor chips, it is necessary to provide the relay board between the semiconductor chips at high precision so that the terminal of the relay board and the electrode pad of the semiconductor chip are positioned at designated corresponding positions.

For example, in a case where the relay board is provided between the semiconductor chips by using an apparatus having a positioning mechanism using image recognition, it is necessary to perform an operation for recognition of an arrangement and positioning of the relay board every time a single relay board is provided between the semiconductor chip. Such an operation requires a lot of time, as a result the productivity of manufacturing the semiconductor device is reduced so that the manufacturing cost for the semiconductor device is increased.

SUMMARY OF THE INVENTION

Accordingly, the present invention may provide a novel and useful relay board provided in a semiconductor device, the semiconductor device, and manufacturing method of the semiconductor device, solving one or more of the problems discussed above.

A preferred embodiment of the present invention may provide a relay board provided in the semiconductor device, the relay board having a structure where bonding positions or the ways of connections of bonding wires can be optionally set, the relay board being capable of being used for semiconductor devices having different functions or structures; a semiconductor device having such a relay board; and a manufacturing method of the semiconductor device whereby the semiconductor device can be manufactured at a low cost.

The above object of the present invention is achieved by a relay board provided in a semiconductor device, including:

an entire main surface that is made of a conductive material.

The relay board may further include:

a substrate made of the same material as at least one semiconductor element provided in the semiconductor device;

wherein the main surface of the relay board may be formed at an upper part of the substrate.

The above object of the present invention is also achieved by a semiconductor device, including:

a first semiconductor element;

a second semiconductor element; and a relay board configured to relay connection between the first semiconductor element and the second semiconductor element, and connection between the second semiconductor element and a wiring board or a lead frame;

wherein the relay board is provided between the first semiconductor element and the second semiconductor element;

an entire main surface of the relay board is made of conductive material; and the relay board and the second semiconductor element, and the relay board and the first semiconductor element, the wiring board, or the lead frame, are connected by bonding wires.

The above object of the present invention is also achieved by a manufacturing method of a semiconductor device having a relay board, the manufacturing method including the steps of:

a) adhering a film adhesive to the relay board;

b) cutting only the relay board at a first part and cutting both the relay board and the adhesive adhered to the relay board at a second part, so that plural divided relay boards adhering to the common single film adhesive are formed; and c) concurrently providing the divided relay boards on a semiconductor element.

According to an embodiment of the present invention, it is possible to provide the relay board provided in the semiconductor device, the relay board having the structure where the bonding positions or the ways of the connections of the bonding wires can be optionally set, the relay board being capable of being used for the semiconductor devices having different functions or structures, the semiconductor device having such a relay board, and the manufacturing method of the semiconductor device whereby the semiconductor device can be manufactured at a low cost.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 1 through FIG. 45 of embodiments of the present invention.

In the following description, first, an embodiment of a relay board and a semiconductor device having the relay board is discussed, and then an embodiment of a manufacturing method of the semiconductor device is discussed. Furthermore, in the following description, a "semiconductor chip" corresponds to a "semiconductor element" in claims.

1. An Embodiment of a Relay Board and a Semiconductor Device Having the Relay Board

First Embodiment

Figure 1:
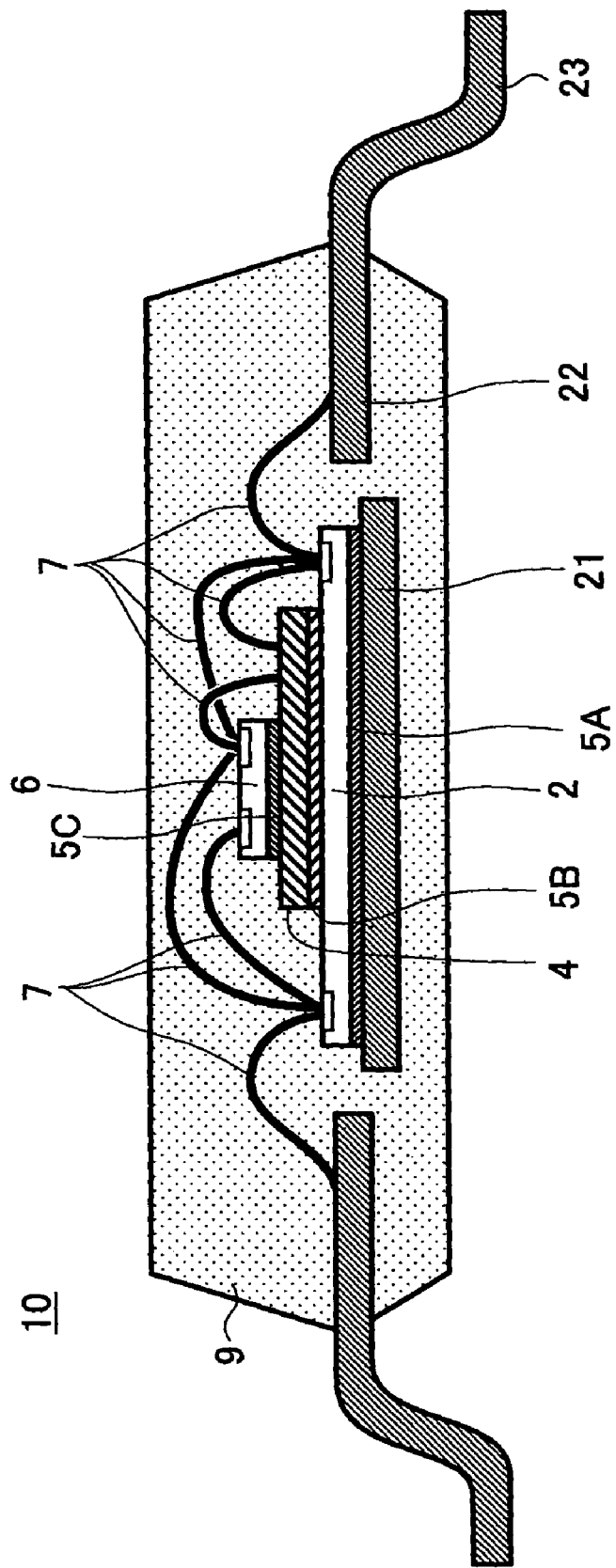
FIG. 1 is a cross-sectional view of a semiconductor device having a relay board of a first embodiment of the present invention.
Figure 2:
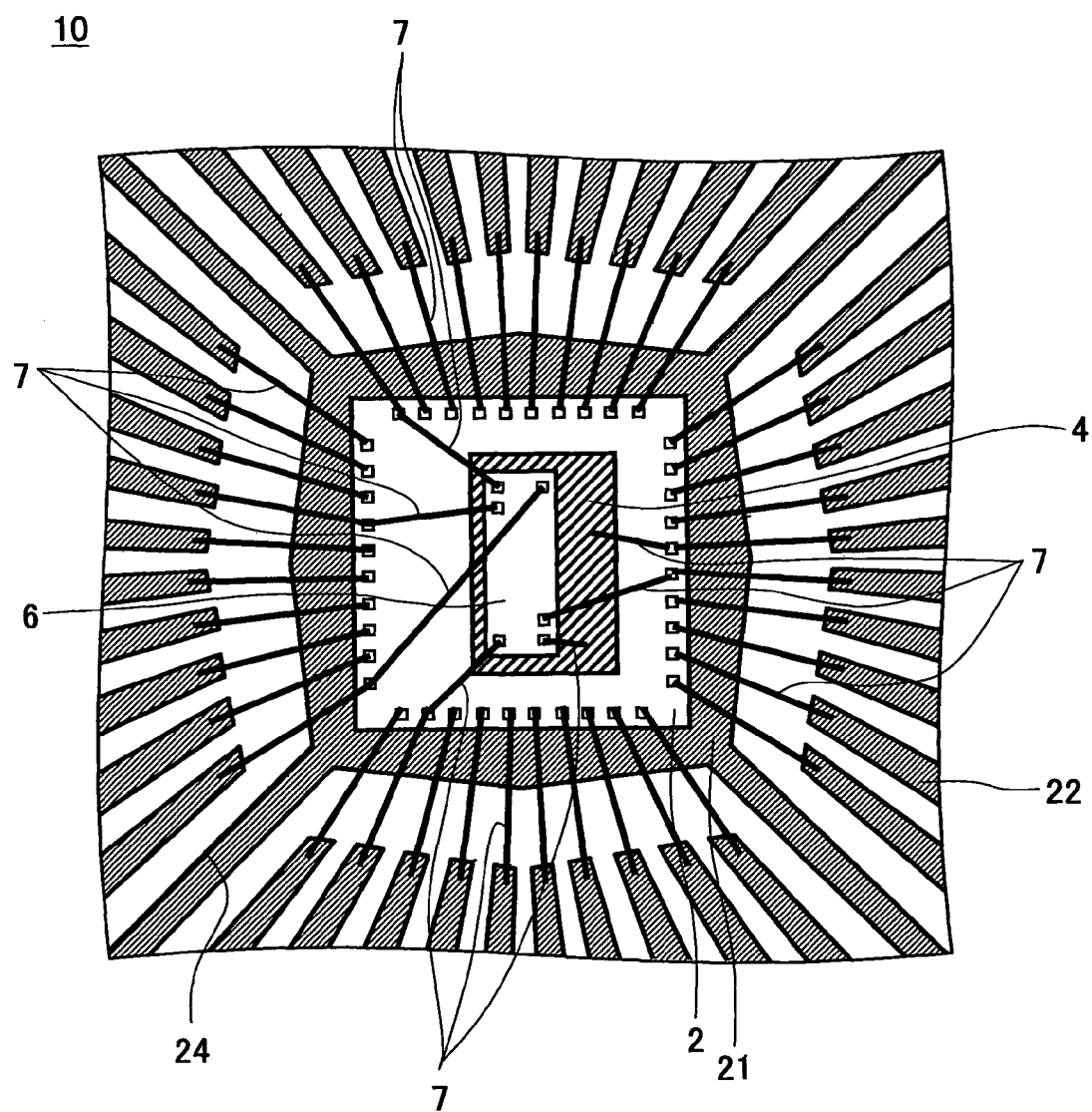
FIG. 2 is a partially expanded plan view of the semiconductor device shown in FIG. 1.
Figure 3:
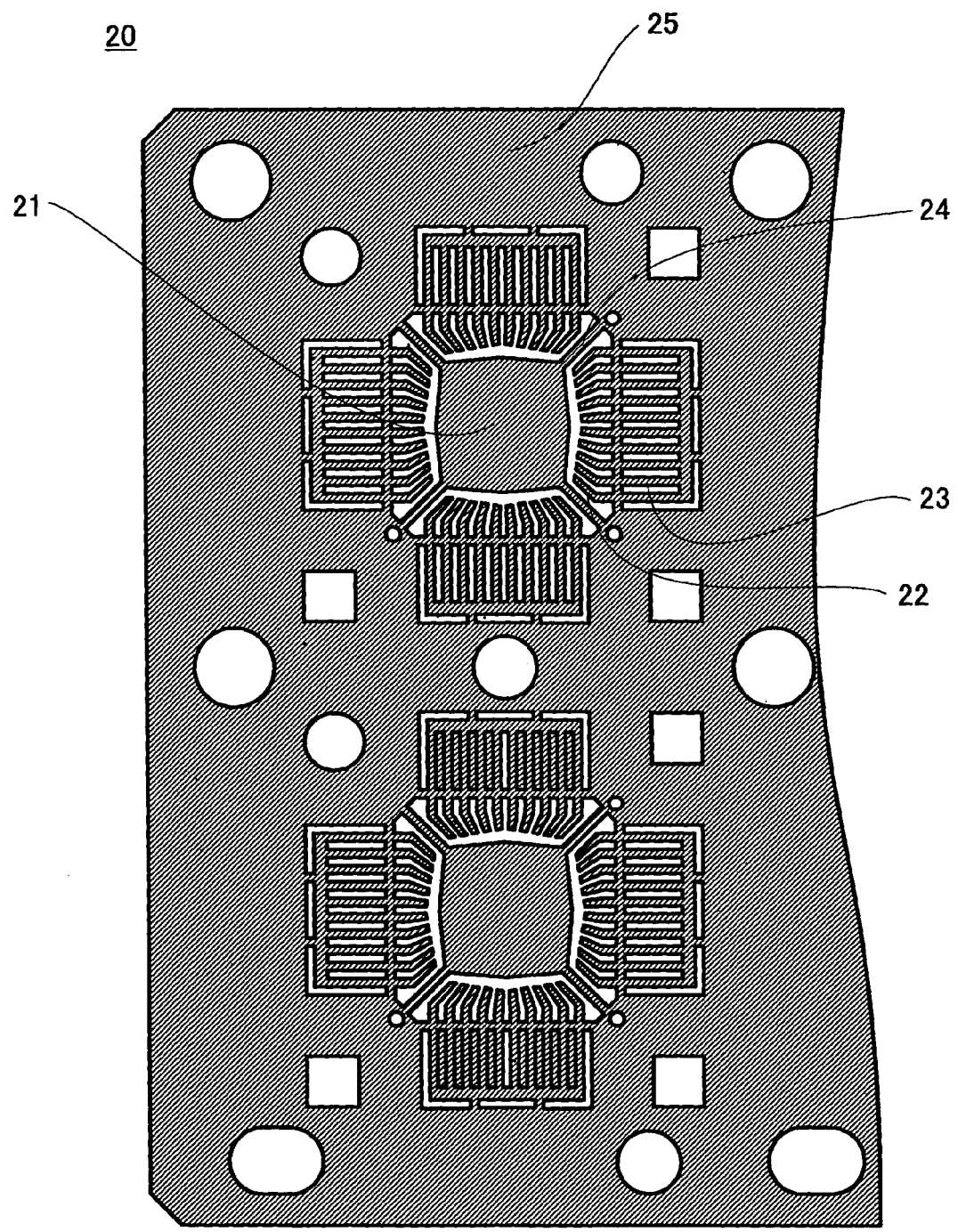
FIG. 3 is a partially expanded plan view of a lead frame.

FIG. 1 is a cross-sectional view of a semiconductor device having a relay board of a first embodiment of the present invention. FIG. 2 is a partially expanded plan view of the semiconductor device shown in FIG. 1. In FIG. 2, illustration of sealing resin 9 shown in FIG. 1 is omitted. FIG. 3 is a partially expanded plan view of a lead frame 20 where a die pad (die stage) 21, an inner lead 22, and the like shown in FIG. 1 and FIG. 2 are formed.

Referring to FIG. 1 and FIG. 2, a semiconductor device 10 having a relay board of a first embodiment of the present invention is a lead frame type Quad Flat Package (QFP) semiconductor device wherein leads as outside connection terminals are provided at four sides of a package.

In the semiconductor device 10, a first semiconductor chip 2 is adhered and fixed on a die pad (die stage) 21 of a lead frame 20 (See FIG. 3) made of a copper alloy, an iron-nickel alloy, or the like, by an adhesive 5A. A relay board 4 having a main surface whose size is smaller than a main surface of the first semiconductor chip 2 is adhered and fixed on the first semiconductor chip 2 by an adhesive 5B. A second semiconductor chip 6 having a main surface whose size is smaller than the main surface of the relay board 4 is adhered and fixed on the relay board 4 by an adhesive 5C. Thus, the relay board 4 is provided between the first semiconductor chip 4 and the second semiconductor chip 6.

Electrodes of the first semiconductor chip 2 and the relay board 4, electrodes of the second semiconductor chip 6 and the relay board 4, the electrode of the first semiconductor chip 2 and the electrode of the second semiconductor chip 6, and the electrode of the first semiconductor chip 2 and the inner lead 22 of the lead frame 20 are respectively connected by the bonding wires 7.

The first semiconductor chip 2, the second semiconductor chip 6, the relay board 4, the bonding wires 7, and the inner lead 22 are sealed by the sealing resin 9. Outer leads 23 as outside connection terminals are projected from the sealing resin 9.

While, a film resin adhesive such as epoxy, polyimide, or the like or a paste resin adhesive may be used as the adhesive 5, the present invention is not limited to this.

Referring to FIG. 3, the die pad (die stage) 21, the inner lead 22, and the outer lead 23 shown in FIG. 1 and FIG. 2 are formed from the lead frame 20 by etching or punching. The outer lead 23 as the outside connection terminal of the semiconductor device 10 is formed outside of the inner lead 22 so as to be connected to the inner lead 22. Furthermore, the die pad 21 is supported by a die pad supporting part 24 connecting to a periphery frame part 25.

Next, the structure of the relay board 4 is discussed with reference to FIG. 4. Here, FIG. 4 is a cross-sectional view of the relay board shown in FIG. 1 and FIG. 2.

Figure 4:
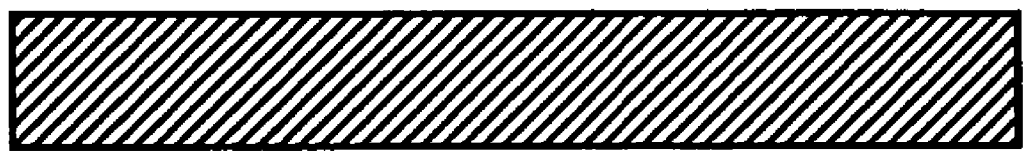
FIG. 4 is a cross-sectional view of the relay board shown in FIG. 1 and FIG. 2.

As shown in FIG. 4, the relay board 4 has a plate-shaped configuration. The relay board is formed by a conductive material and the entire main surface (upper surface) of the relay board 4 is a continuous conductive surface. The relay board 4 is made of a metal such as copper, aluminum, gold, silver, titanium, or the like or an alloy of either of these metals.

The thickness, namely the distance in upper and lower directions in FIG. 4, of the relay board 4 may be approximately 20 through 300 μm. In order to make the semiconductor device thin, it is preferable that the relay board 4 have thickness equal to or less than, for example, 150 μm.

In addition, the thickness of the relay board 4 may be the substantially the same as the thickness of the semiconductor chip 2 or 6 (See FIG. 1 or FIG. 2). In this case, the same apparatus used for providing the semiconductor chips 2 and 6 can be used and therefore it is possible to easily provide the relay board 4 on the first semiconductor chip 2.

Furthermore, metal plating such as gold plating, copper plating, silver plating, double-layer plating of nickel and gold, triple-layer plating of nickel, palladium, and gold, triple-layer plating of copper, nickel, and gold, or the like may be formed on a main surface (upper surface) of the relay board 4. For example, in a case where the gold plating is formed on the main surface (upper surface) of the relay board 4, since gold has good connectivity with bonding wire, it is possible to achieve good wire bonding.

In the case where the metal plating is formed on the main surface (upper surface) of the relay board 4, although the thickness of the plating is properly selected depending on kinds of metals, the thickness may be equal to or greater than approximately 0.02 μm or equal to or less than 20 μm.

Thus, in the relay board 4 of this embodiment, unlike the related art relay boards, while the designated wiring patterns and terminals are not formed, the entire main surface (upper surface) is formed as a conductive surface. Accordingly, depending on the size of the semiconductor chip or the number and arrangement of the electrode pads, it is possible to make wire bonding at any position on the relay board 4 and therefore the relay board 4 can be widely used.

Figure 5:
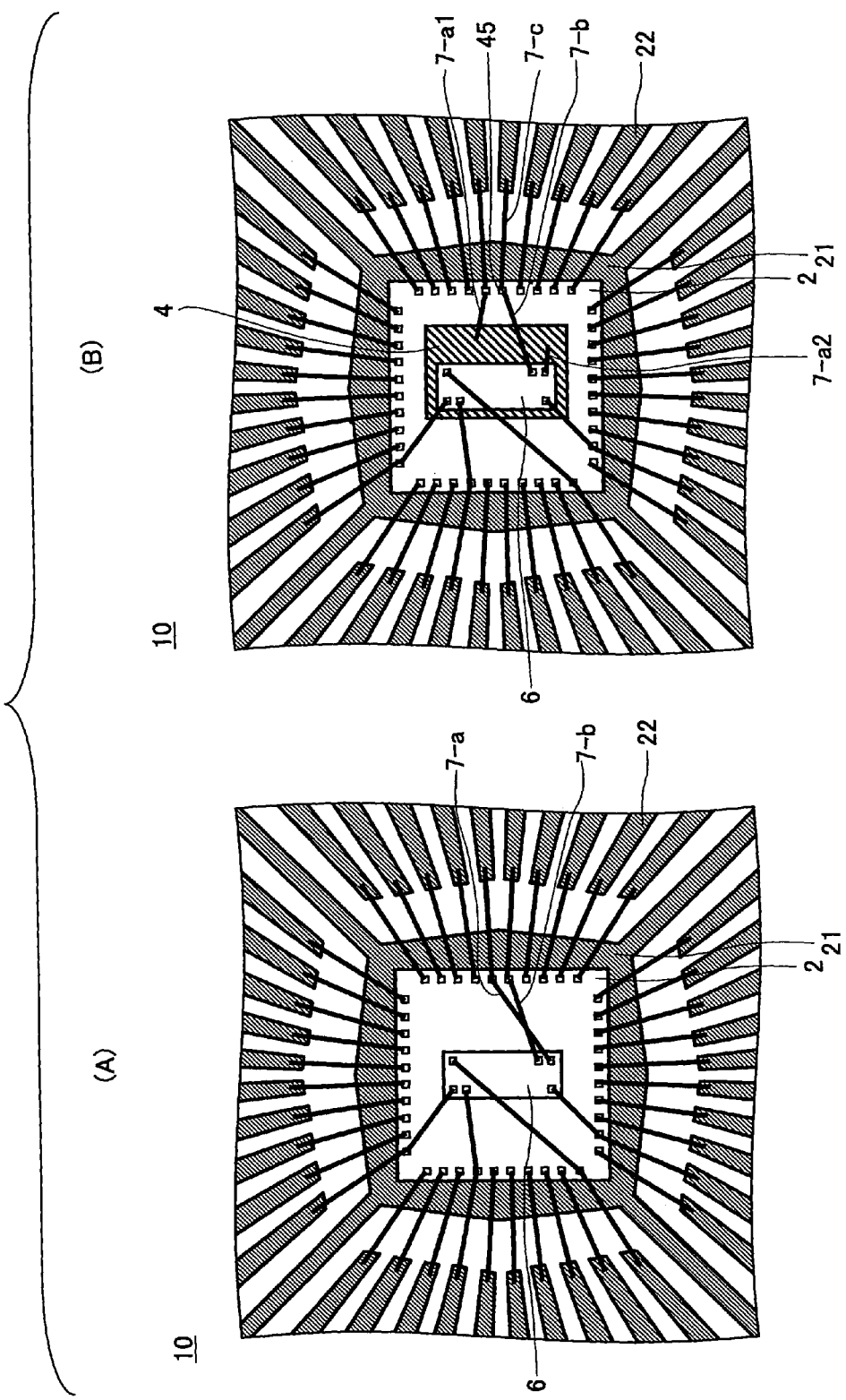
FIG. 5 is a plan view showing the difference between a case where the relay board of the first embodiment of the present invention is provided between a first semiconductor chip and a second semiconductor chip and a case where the relay board of the first embodiment of the present invention is not provided between the first semiconductor chip and the second semiconductor chip.

In a case where the relay board 4 is not provided between the first semiconductor chip 2 and the second semiconductor chip 6 as shown in FIG. 5-(A), bonding wires 7-a and 7-b connecting the first semiconductor chip 2 and the second semiconductor chip 6 cross each other.

However, by providing the relay board 4 whose entire main surface (upper surface) is a conductive surface between the first semiconductor chip 2 and the second semiconductor chip 6 like this embodiment (See FIG. 5-(b)), the connection by the bonding wire 7-a of FIG. 5-(a) can be achieved by short bonding wires 7-a1 and 7-a2 via the relay board 4. Hence, it is possible to avoid crossing of the bonding wires 7-a and 7-b.

In the meantime, the structure of the relay board 4 is not limited to the structure shown in FIG. 4. The structure of the relay board 4 may be as shown in FIG. 6 through 12.

Figure 6:
FIG. 6 is a cross-sectional view of a first modified example of the relay board of the first embodiment of the present invention.

FIG. 6 is a cross-sectional view of a relay board 30 of a first modified example of the relay board 4 of the first embodiment of the present invention.

Referring to FIG. 6, in this example, a conductive part 32 is provided on a base part 31.

The base part 31 is made of an organic material such as epoxy, polyimide, or the like or an inorganic material such as glass, ceramic or the like. The thickness, namely the distance in upper and lower direction in FIG. 6, of the base part 31 may be equal to or greater than approximately 20 μm and equal to or less than 300 μm.

The conductive part 32, as well as the relay board 4 shown in FIG. 4, is made of a metal such as copper, aluminum, gold, silver, titanium, or the like or an alloy of any of these metals. The entire main surface (upper surface) of the conductive part 32 is a continuous conductive surface. The thickness, namely the distance in upper and lower directions in FIG. 6, of the conductive part 32 may be approximately 2 through 30 μm.

Forming the conductive part 32 on the base part 31 can be accomplished by adhesion of a film of such a metal using an adhesive, a vapor deposition method, a non-electrolytic plating, or the like, depending on the material of the base part 31.

Furthermore, metal plating such as gold plating, copper plating, silver plating, double-layer plating of nickel and gold, triple-layer plating of nickel, palladium, and gold, triple-layer plating of copper, nickel, and gold, or the like may be formed on a main surface (upper surface) of the conductive part 32, as well as the relay board 4.

In the case where the metal plating is formed on the main surface (upper surface) of the conductive part 32, although the thickness of the plating is properly selected depending on kinds of metals, the thickness may be equal to or greater than approximately 0.02 μm and equal to or less than 20 μm.

Figure 7:
FIG. 7 is a cross-sectional view of a second modified example of the relay board of the first embodiment of the present invention.

FIG. 7 is a cross-sectional view of a relay board 35 of a second modified example of the relay board 4 of the first embodiment of the present invention.

Referring to FIG. 7, in this example, an insulation layer 37 is formed on a substrate 36 and the conductive part 32 is provided on the insulation layer 37.

The substrate 36 is made of the same material as either the first semiconductor chip 2 or the second semiconductor chip 6, such as silicon or the like. Accordingly, the same apparatus for manufacturing the first semiconductor chip 2 and the second semiconductor chip 6 can be used for manufacturing the relay board 35. Hence, the external configuration (thickness) of the relay board 35 can be made at as good precision as the first semiconductor chip 2 or the second semiconductor chip 6.

In addition, the same apparatus and adhesive used for stacking the second semiconductor chip 6 on the relay board 35 and the adhesive 5C can be used for stacking the relay board 35 on the first semiconductor chip 2 and the adhesive 5B.

Furthermore, since the substrate 36 is made of the same material as either the first semiconductor chip 2 or the second semiconductor chip 6, it is possible to reduce concentration of strain due to thermal stress inside the semiconductor device 10 based on the difference of coefficients of thermal expansion of the materials.

The thickness, namely the distance in upper and lower directions in FIG. 7, of the substrate 36 may be approximately 20 through 300 μm.

The insulation film 37 is made of, for example, a silicon oxide film, an insulation resin film, or the like. The thickness of the insulation film 37 may be equal to or greater than approximately 0.5 μm and equal to or less than 1 μm.

The conductive part 32, as well as the conductive part 32 shown in FIG. 6, is made of a metal such as, for example, copper, aluminum, gold, silver, titanium, or the like or an alloy of any of these metals. The entire main surface (upper surface) of the conductive part 32 is a continuous conductive surface. The thickness, namely the distance in upper and lower directions in FIG. 7, of the conductive part 32 may be approximately 2 through 30 μm.

Furthermore, metal plating such as gold plating, copper plating, silver plating, double-layer plating of nickel and gold, triple-layer plating of nickel, palladium, and gold, triple-layer plating of copper, nickel, and gold, or the like may be formed on a main surface (upper surface) of the conductive part 32.

In the case where the metal plating is formed on the main surface (upper surface) of the conductive part 32, although the thickness of the plating is properly selected depending on kinds of metals, the thickness may be equal to or greater than approximately 0.02 μm and equal to or less than 20 μm.

Figure 8:
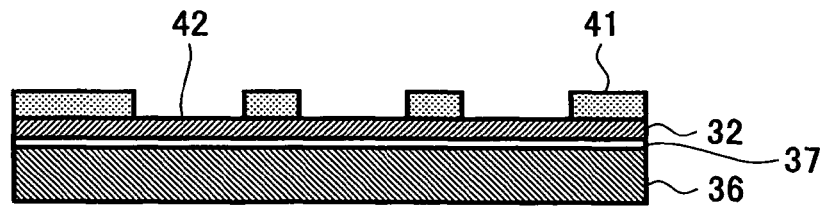
FIG. 8 is a cross-sectional view of a third modified example of the relay board of the first embodiment of the present invention.

FIG. 8 is a cross-sectional view of a relay board 40 of a third modified example of the relay board 4 of the first embodiment of the present invention. In FIG. 8, parts that are the same as the parts shown in FIG. 7 are given the same reference numerals, and explanation thereof is omitted.

Referring to FIG. 8, a resin film 41 having designated opening parts 42 exposing the main surface of the conductive part 32, the opening parts 42 not overlapping the second semiconductor chip 6 (See FIG. 1 or FIG. 2) when the second semiconductor chip 6 is provided on the main surface.

The resin film 41 is made of, for example, an insulation resin such as polyimide, epoxy, or the like.

The bonding wire 7 (See FIG. 1 or FIG. 2) is connected to the opening part 42 in order to electrically connect the relay board 40 and first semiconductor chip 2, the second semiconductor chip 6, or the inner lead 22. Therefore, as long as the opening part 42 has an opening diameter of 50 μm or more, sufficient for performing the wire bonding, there is no limitation to the size or configuration of the opening part 42.

Furthermore, the resin film 41 is formed so that a part where the wire bonding is not made, the part not overlapping the installed second semiconductor chip 6 is selectively covered. Therefore, it is possible to improve the adhesion between the relay board 40 and the sealing resin 9 (FIG. 1). In other words, since the adhesion between the resin and the sealing resin is better than the adhesion between the metal surface and the sealing resin, according to the above-discussed structure, it is possible to improve the adhesion between the relay board 40 and the sealing resin 9 so that the reliability of the semiconductor device can be improved.

From the perspective of the adhesion between the relay board 40 and the sealing rein 9, it may be preferable to make the size of the opening part 42 smaller. However, since the relay board should be widely usable, it is preferable that the wire bonding is capable of being made at any position on the relay board, depending on the size of the semiconductor chip or the number and arrangement of the electrode pads formed on the semiconductor chip.

Therefore, the opening pattern of the opening part 42 may be as shown in FIG. 9 through FIG. 12. Here, FIG. 9 through FIG. 12 are plan views showing first through fourth examples of an opening pattern of an opening part of the relay board 40.

Figure 9:
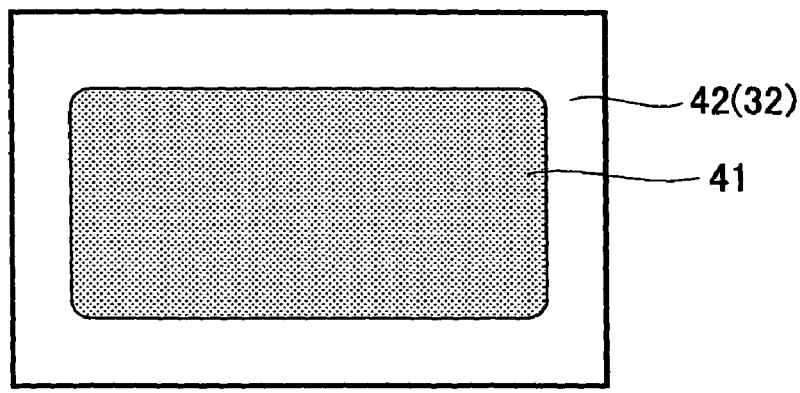
FIG. 9 is a view showing a first example of an opening pattern of an opening part, the view being the plan view of the relay board.

In the example shown in FIG. 9, the resin film 41 is provided in the substantially center of the main surface. The opening part 42 is formed in the periphery of the resin film 41 so that the conductive part 32 is exposed.

Figure 10:
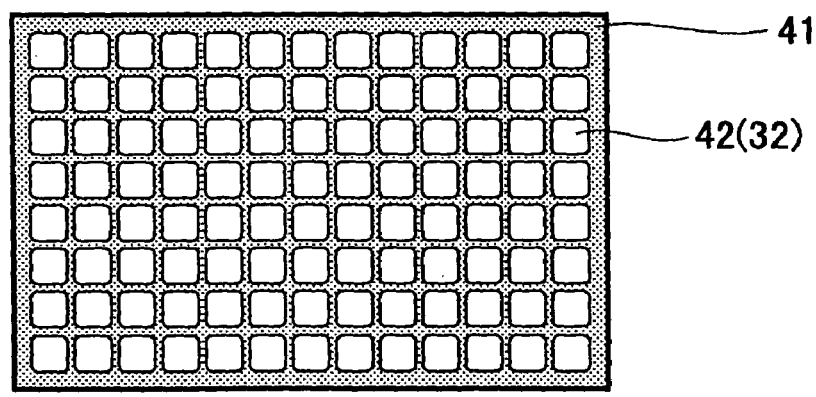
FIG. 10 is a view showing a second example of an opening pattern of an opening part, the view being the plan view of the relay board.

In the example shown in FIG. 10, the resin film 41 is provided along four sides of the main surface. The resin film 41 and the opening parts 42 are mutually provided from the four sides in a lattice state. The conductive part 32 is exposed at the opening parts 42.

Figure 11:
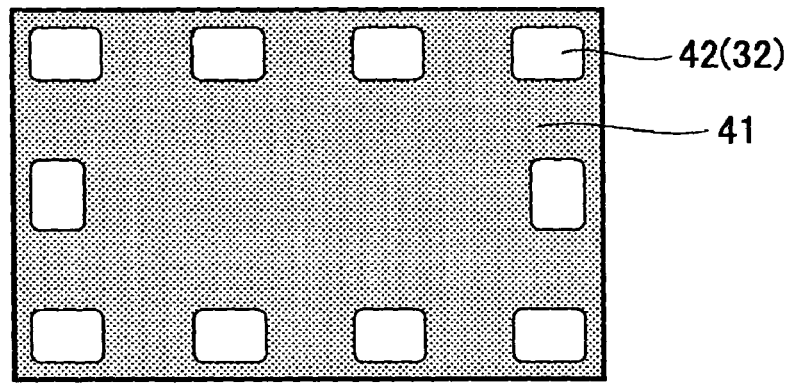
FIG. 11 is a view showing a third example of an opening pattern of an opening part, the view being the plan view of the relay board.

In the example shown in FIG. 11, the resin film 41 is provided on the entire surface of the main surface. The opening parts 42 are partially formed along the four sides of the main surface so that the conductive part 32 is exposed at the opening parts 42.

Figure 12:
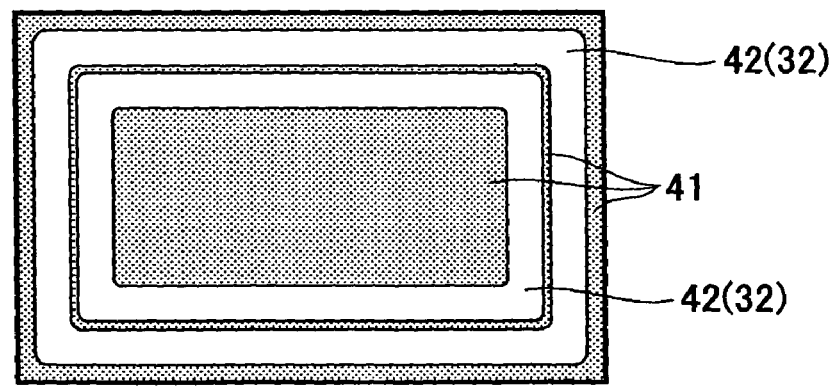
FIG. 12 is a view showing a fourth example of an opening pattern of an opening part, the view being the plan view of the relay board.

In the example shown in FIG. 12, the resin film 41 is provided in the substantially center of the main surface. One opening part 42 is formed in the periphery of the resin film 41 and the resin film 41 is formed in the periphery of another opening part 42, so that the conductive part 32 is exposed at the opening parts 42.

Thus, since the opening parts 42 are formed with a designated pattern on the resin film 41 provided on the main surface of the relay board 40 so that the conductive part 32 is exposed, it is possible to improve the adhesion between the relay board 40 and the sealing resin 9 and easily position of the bonding when the wire bonding is made by using the opening part 42.

Next, a connection structure of plural bonding wires on a pad in this embodiment is discussed with reference to FIG. 5-(B) and FIG. 13. Here, FIG. 13 is a side view showing the connection structure of plural bonding wires on the pad.

Figure 13:
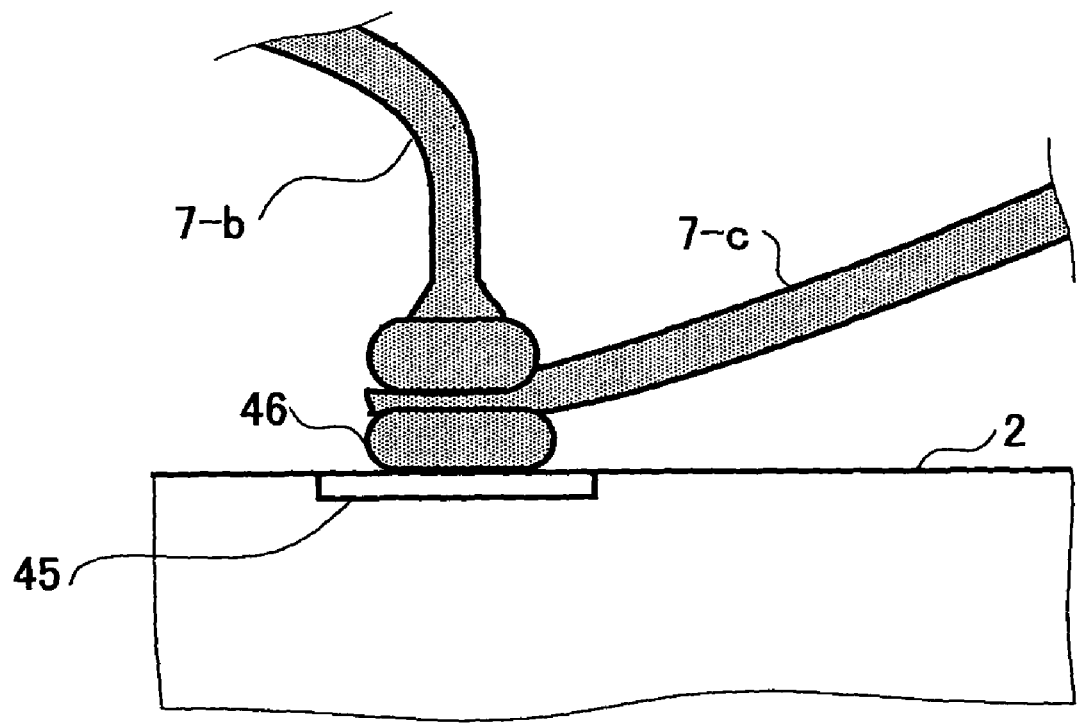
FIG. 13 is a side view showing a connection structure of plural bonding wires on a pad.

Referring to FIG. 5-(B) and FIG. 13, a stud bump 46 is provided on a pad 45 provided on the first semiconductor chip 2. An end part of a bonding wire 7-*c* connecting to the inner lead 22 is connected on the stud bump 46. Furthermore, a bonding wire 7-*b* connecting the second semiconductor chip 6 is stuck on the bonding wire 7-*c*.

Since the stud bump 46 is provided on the pad 45, it is possible for the bonding wire 7-*c* to be situated higher due to the height of the stud bump 46. Accordingly, it is possible to prevent the bonding wire 7-*c* from dropping and coming in contact with the surface of the first semiconductor chip 2 or another wire.

In addition, since the bonding wire 7-*c* is put between the bonding wire 7-*b* and the stud bump 46, it is possible to increase the contact capability between the bonding wires 7-*c* and the stud bump 46.

Thus, in the relay boards 4, 30, 35 and 40 of this embodiment, unlike the related art relay boards, while the designated wiring patterns and terminals are not formed, the entire main surface (upper surface) is formed as a conductive surface.

Accordingly, depending on the size of the semiconductor chips 2 and 6 or the number and arrangement of the electrode pads formed on the semiconductor chips 2 and 6, it is possible to perform wire bonding at any position on the relay boards 4, 30, 35 and 40; therefore the relay board 4, 30, 35 and 40 can be widely used.

The main surfaces of the relay boards 4, 30, 35 and 40 in this embodiment are larger than the main surface of the second semiconductor chip 6. Therefore, it is possible to perform wire bonding at any part of the relay board 4, 30, 35 and 40 not overlapping the second semiconductor chip 6, so that the second semiconductor chip 6 and the relay boards 4, 30, 35 and 40 are connected. Therefore, it is possible to improve the degree of design freedom of a part where the bonding wiring is placed.

In addition, it is not necessary to provide the relay boards 4, 30, 35 and 40 on the first semiconductor chip 2 at high precision. Therefore, since the manufacturing margin of positioning is increased, the manufacturing yield rate of the semiconductor device can be increased.

Furthermore, the designated wiring pattern and terminal are not formed in the relay boards 4, 30, 35 and 40 in this embodiment. Therefore, it is possible to reduce the manufacturing cost of the relay board.

In addition, crossing of the bonding wire 7 occurring when the relay boards 4, 30, 35 and 40 are not provided can be avoided and the wire length of the bonding wire 7 can be shortened. Therefore, it is possible to improve the manufacturing yield rate of the semiconductor device 10 and height of the wire loop of the bonding wire 7 can be made short. Accordingly, it is possible to reduce the height of the semiconductor device 10 so that the semiconductor device 10 can be made thin.

Furthermore, the relay boards 4, 30, 35 and 40 may be electrically connected to the power supply electrode or the ground electrode of the second semiconductor chip 6. In this case, since the relay boards 4, 30, 35 and 40 and the conductive part 32 have constant potentials, it is possible to reduce the noise between the semiconductor chip 2 and the second semiconductor chip 6. Thus, it is possible to make the operation of the semiconductor device 10 stable so that an electrical property is improved.

Therefore, even in a case where an operating frequency of the first semiconductor chip 2 or the second semiconductor chip 6 becomes high, or even in a case where the second semiconductor chip 6 is thin and a circuit surface of the first semiconductor chip 2 and a circuit surface of the second semiconductor chip 6 are close so that the mutual impedance is increased and the first semiconductor chip 2 and the second semiconductor chip 6 are adversely affected, it is possible to stably operate the semiconductor device 10. Thus, according to this embodiment, it is possible to make the semiconductor device thinner or speedy.

Second Embodiment

Next, a second embodiment of the present invention is discussed. In the following description, parts that are the same as the parts shown in FIG. 1 through FIG. 13 are given the same reference numerals, and explanation thereof is omitted.

Figure 14:
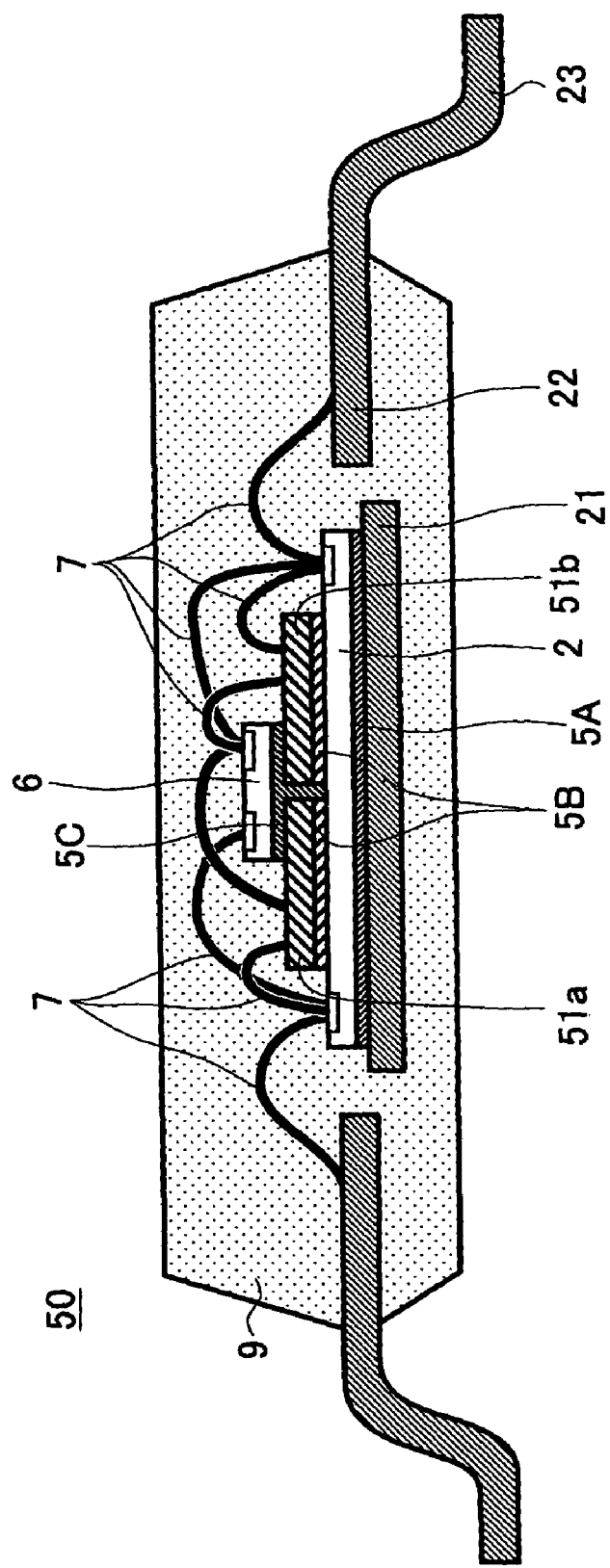
FIG. 14 is a cross-sectional view of a semiconductor device having a relay board of a second embodiment of the present invention.
Figure 15:
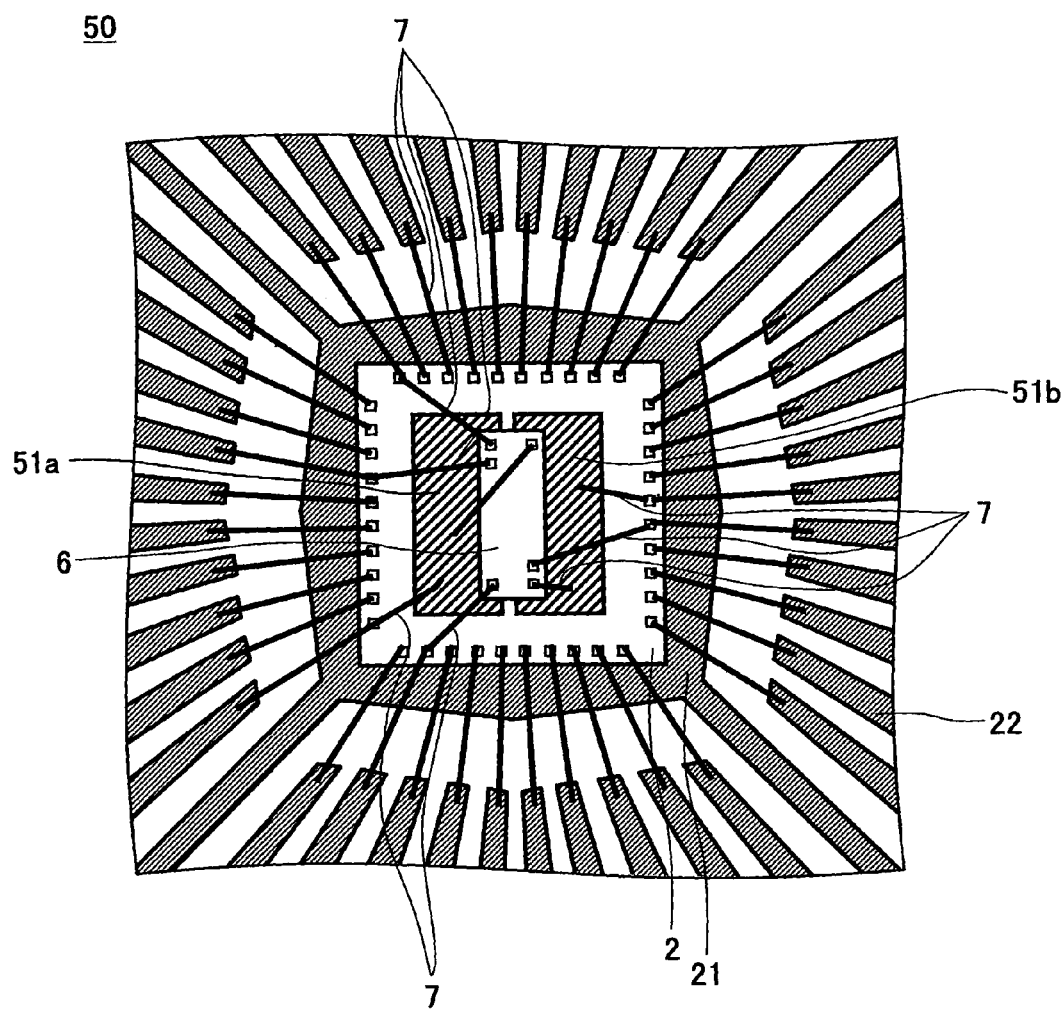
FIG. 15 is a partially expanded plan view of the semiconductor device shown in FIG. 14.

FIG. 14 is a cross-sectional view of a semiconductor device having a relay board of a second embodiment of the present invention. FIG. 15 is a partially expanded plan view of the semiconductor device shown in FIG. 14. In FIG. 15, illustration of sealing resin 9 shown in FIG. 14 is omitted.

In the above-discussed first embodiment, the relay board whose main surface is smaller than the main surface of the first semiconductor chip is adhered and fixed on the first semiconductor chip, and the second semiconductor chip whose main surface is smaller than the main surface of the relay board is adhered and fixed on the relay board.

On the other hand, in the second embodiment of the present invention, plural relay boards 51a and 51b whose main surfaces are smaller than the main surface of the first semiconductor chip 2 are adhered and fixed on the first semiconductor chip 2 via the adhesive 5B. The relay boards 51a and 51b are independently adhered and fixed on the first semiconductor chip 2 in parallel with a small gap therebetween.

Furthermore, in the second embodiment of the present invention, the second semiconductor chip 6 is adhered and fixed on parts of the relay boards 51a and 51b via the adhesive 5C.

The relay boards 51a and 51b and the electrode of the first semiconductor chip 2, the relay boards 51a and 51b and the electrode of the second semiconductor chip 6, the electrode of the first semiconductor chip 2 and the electrode of the second semiconductor chip 6, and the electrode of the first semiconductor chip 2 and the inner lead 22 of the lead frame 20, are connected by the bonding wires 7.

In the examples shown in FIG. 14 and FIG. 15, the relay boards 51a and 51b, as well as the relay board 4 shown in FIG. 4, are formed by a conductive material and the entire main surfaces (upper surfaces) of the relay boards 51a and 51b are conductive. Designated wiring pattern and terminals are not formed on the relay boards 51a and 51b, unlike the related art relay boards. Furthermore, external configurations of the relay boards 51a and 51b are substantially plate-shaped.

However, the present invention is not limited to this example. For example, the internal structure of the relay board 51a or 51b may be the structure shown in FIG. 6 or FIG. 7. The main surface of the relay board 51a or 51b may have the structure shown in FIG. 8 through FIG. 12.

Figure 16:
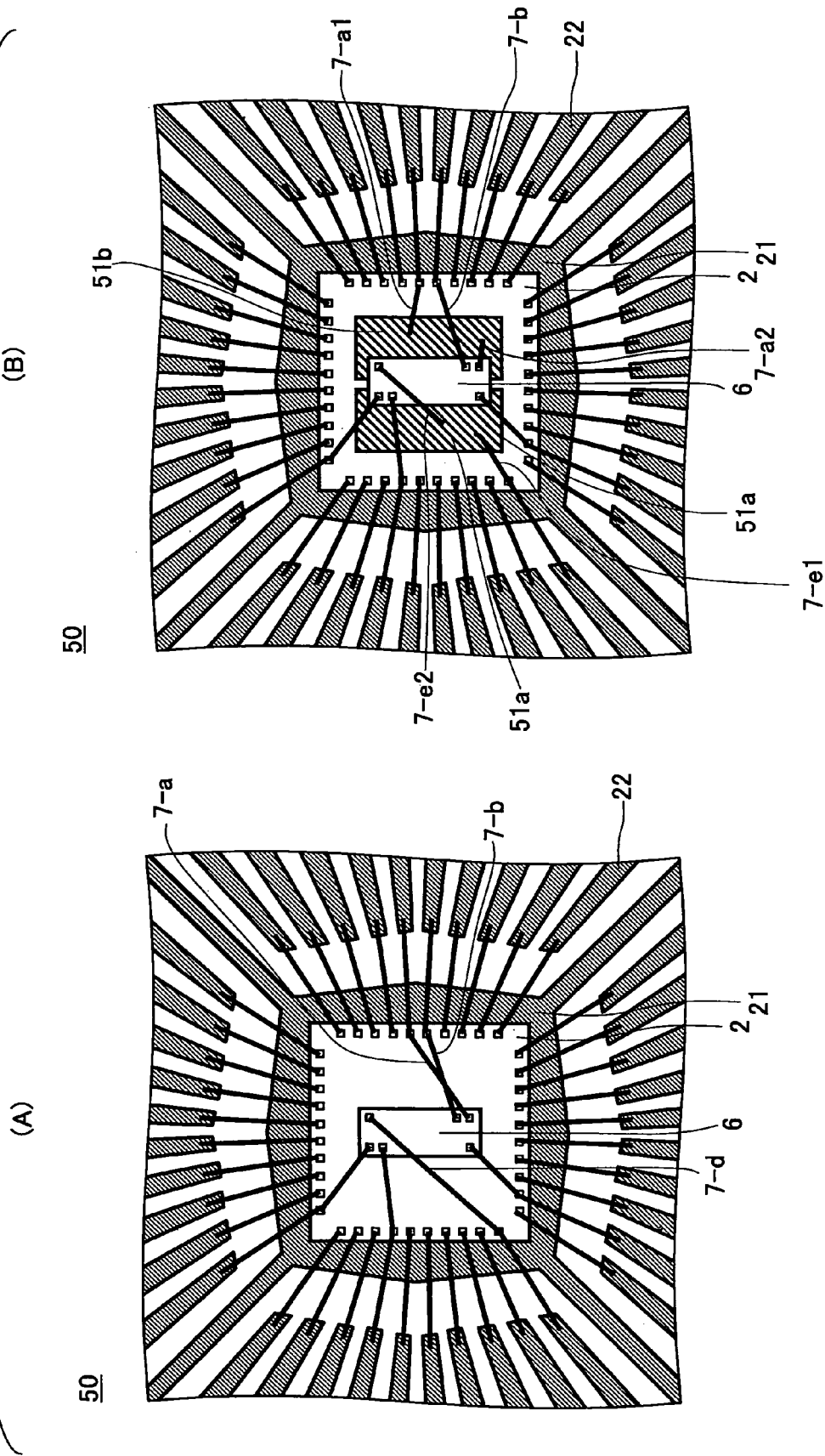
FIG. 16 is a plan view showing the difference between a case where the relay board of the second embodiment of the present invention is provided between a first semiconductor chip and a second semiconductor chip and a case where the relay board of the second embodiment of the present invention is not provided between the first semiconductor chip and the second semiconductor chip.

As shown in FIG. 16-(A), in a case where the relay boards 51a and 51b are not provided between the first semiconductor chip 2 and the second semiconductor chip 6, the bonding wires 7-a and 7-b connecting the first semiconductor chip 2 and the second semiconductor chip 6 cross each other. Furthermore, the bonding wire 7-d is long.

However, in this embodiment, as shown in FIG. 16-(B), plural relay boards 51a and 51b whose main surfaces are smaller than the main surface of the first semiconductor chip 2 are adhered and fixed on the first semiconductor chip 2 via the adhesive 5B. The relay boards 51a and 51b are independently adhered and fixed on the first semiconductor chip 2 in parallel with a small gap therebetween.

Therefore, the connection by the bonding wire 7-d in FIG. 16-(a) can be achieved by the connection in FIG. 16-(b) by the short bonding wires 7-e1 and 7-e2 via the relay board 51-a so that the wire length of the bonding wire can be shortened. In addition, the connection by the bonding wire 7-a in FIG. 16-(a) can be achieved by the connection by the short bonding wires 7-a1 and 7-a2 via the relay board 51-b in FIG. 16-(b) so that crossing of the bonding wires 7-a and 7-b can be avoided.

Although two relay boards whose main surfaces have substantially rectangular-shaped configurations are used in the examples shown in FIG. 14 through FIG. 16, the present invention is not limited to this. For example, examples shown in FIG. 17-(A) through FIG. 20-(A) may be applied.

Figure 17:
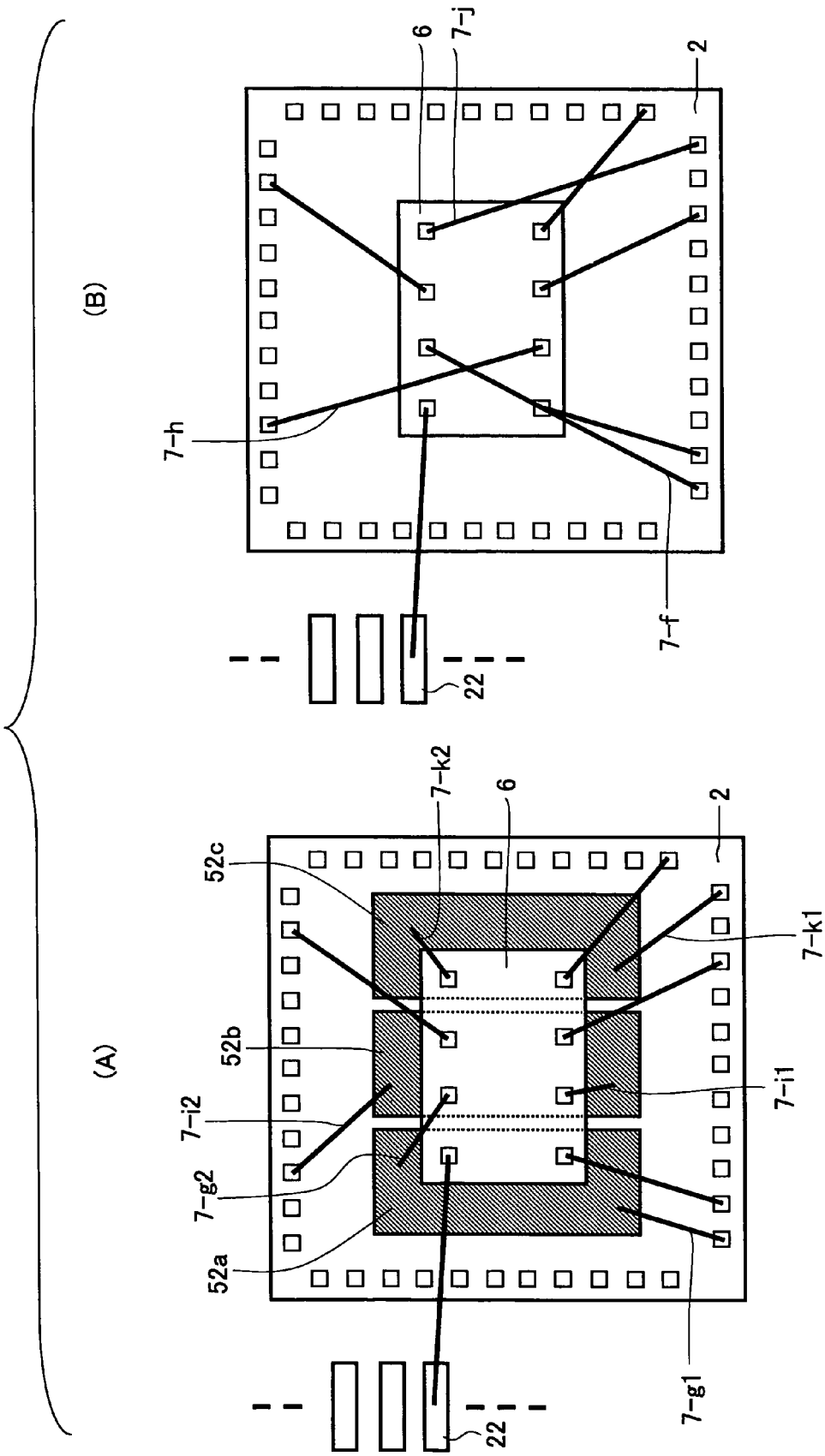
FIG. 17 is a cross-sectional view of a first modified example of the relay board of the second embodiment of the present invention.

Here, FIG. 17 through FIG. 20 are cross-sectional views of first through fourth modified examples of the relay board of the second embodiment of the present invention. FIG. 17-(A) through FIG. 20-(A) show cases where the relay board is provided between the first semiconductor chip 2 and the second semiconductor chip 6. FIG. 17-(B) through FIG. 20-(B) show cases where the relay board is not provided between the first semiconductor chip 2 and the second semiconductor chip 6.

In the example shown in FIG. 17-(A), plural relay boards 52a, 52b and 52c whose main surfaces are smaller than the main surface of the first semiconductor chip 2 are adhered and fixed on the first semiconductor chip 2. The relay boards 52a, 52b and 52c are independently adhered and fixed on the first semiconductor chip 2 in parallel with a small gaps therebetween. The entire main surfaces (upper surfaces) of the relay boards 52a, 52b and 52c are continuous conductive surfaces. The second semiconductor chip 6 is provided on parts of the relay boards 52a, 52b and 52c.

As shown in FIG. 17-(B), in a case where the relay boards 52a, 52b and 52c are not provided between the first semiconductor chip 2 and the second semiconductor chip 6, the lengths of bonding wires 7-f, 7-h and 7-j connecting the first semiconductor chip 2 and the second semiconductor chip 6 are long and the neighboring bonding wires cross each other.

However, as shown in FIG. 17-(A), in a case where the relay boards 52a, 52b and 52c are provided between the first semiconductor chip 2 and the second semiconductor chip 6, the connection by the bonding wire 7-f in FIG. 17-(B) can be achieved in FIG. 17-(A) by the connection by the short bonding wires 7-g1 and 7-g2 via the relay board 52a, the connection by the bonding wire 7-h in FIG. 17-(A) can be achieved in FIG. 17-(A) by the connection by the short bonding wires 7-i1 and 7-i2 via the relay board 52b, and the connection by the bonding wire 7-j in FIG. 17-(B) can be achieved in FIG. 17-(A) by the connection by the short bonding wires 7-k1 and 7-k2 via the relay board 52c, so that the wire length of the bonding wire can be shortened and crossing of the neighboring bonding wires can be avoided.

Figure 18:
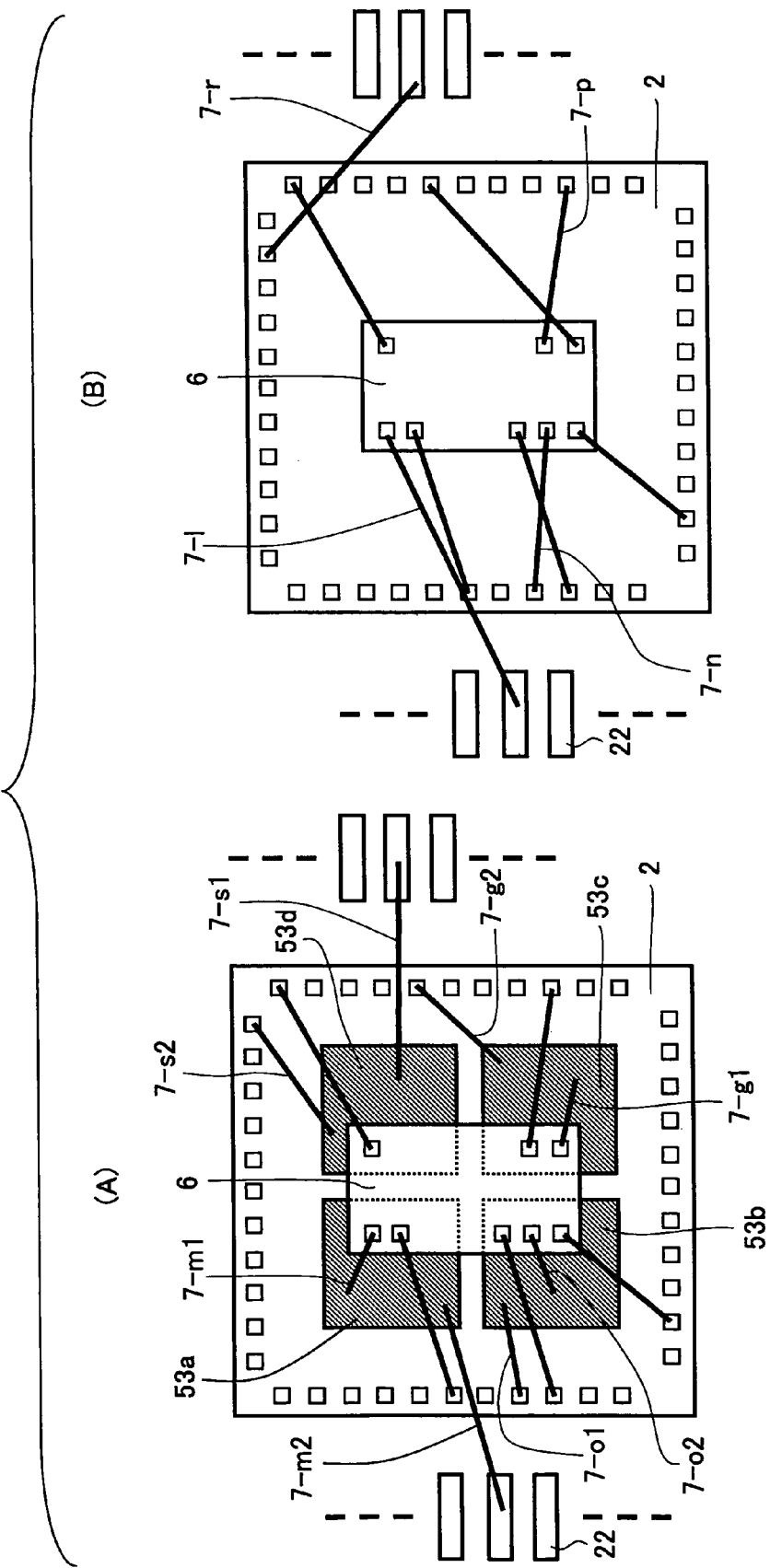
FIG. 18 is a cross-sectional view of a second modified example of the relay board of the second embodiment of the present invention.

In the example shown in FIG. 18-(A), plural relay boards 53a, 53b, 53c and 53d whose main surfaces are smaller than the main surface of the first semiconductor chip 2 are adhered and fixed on the first semiconductor chip 2. The relay boards 53a, 53b, 53c and 53d are independently adhered and fixed on the first semiconductor chip 2 with small gaps therebetween so as to be a substantially square shape as a whole. The entire main surfaces (upper surfaces) of the relay boards 53a, 53b, 53c and 53d are continuous conductive surfaces. The second semiconductor chip 6 is provided on parts of the relay boards 53a, 53b, 53c and 53d.

As shown in FIG. 18-(B), in a case where the relay boards 53a, 53b, 53c and 53d are not provided between the first semiconductor chip 2 and the second semiconductor chip 6, the lengths of bonding wires 7-l, 7-n, 7-p and 7-r connecting the first semiconductor chip 2 and the second semiconductor chip 6 are long and the neighboring bonding wires cross each other.

However, as shown in FIG. 18-(A), in a case where the relay boards 53a, 53b, 53c and 53d are provided between the first semiconductor chip 2 and the second semiconductor chip 6, the connection by the bonding wire 7-l can be achieved in FIG. 18-(A) by the connection by the short bonding wires 7-m1 and 7-m2 via the relay board 53a, the connection by the bonding wire 7-n can be achieved in FIG. 18-(A) by the connection by the short bonding wires 7-o1 and 7-o2 via the relay board 53b, the connection by the bonding wire 7-p can be achieved in FIG. 18-(A) by the connection by the short bonding wires 7-q1 and 7-q2 via the relay board 53c, and the connection by the bonding wire 7-r can be achieved in FIG. 18-(A) by the connection by the short bonding wires 7-s1 and 7-s2 via the relay board 53d, so that the wire length of the bonding wire can be shortened and crossing of the neighboring bonding wires can be avoided.

Figure 19:
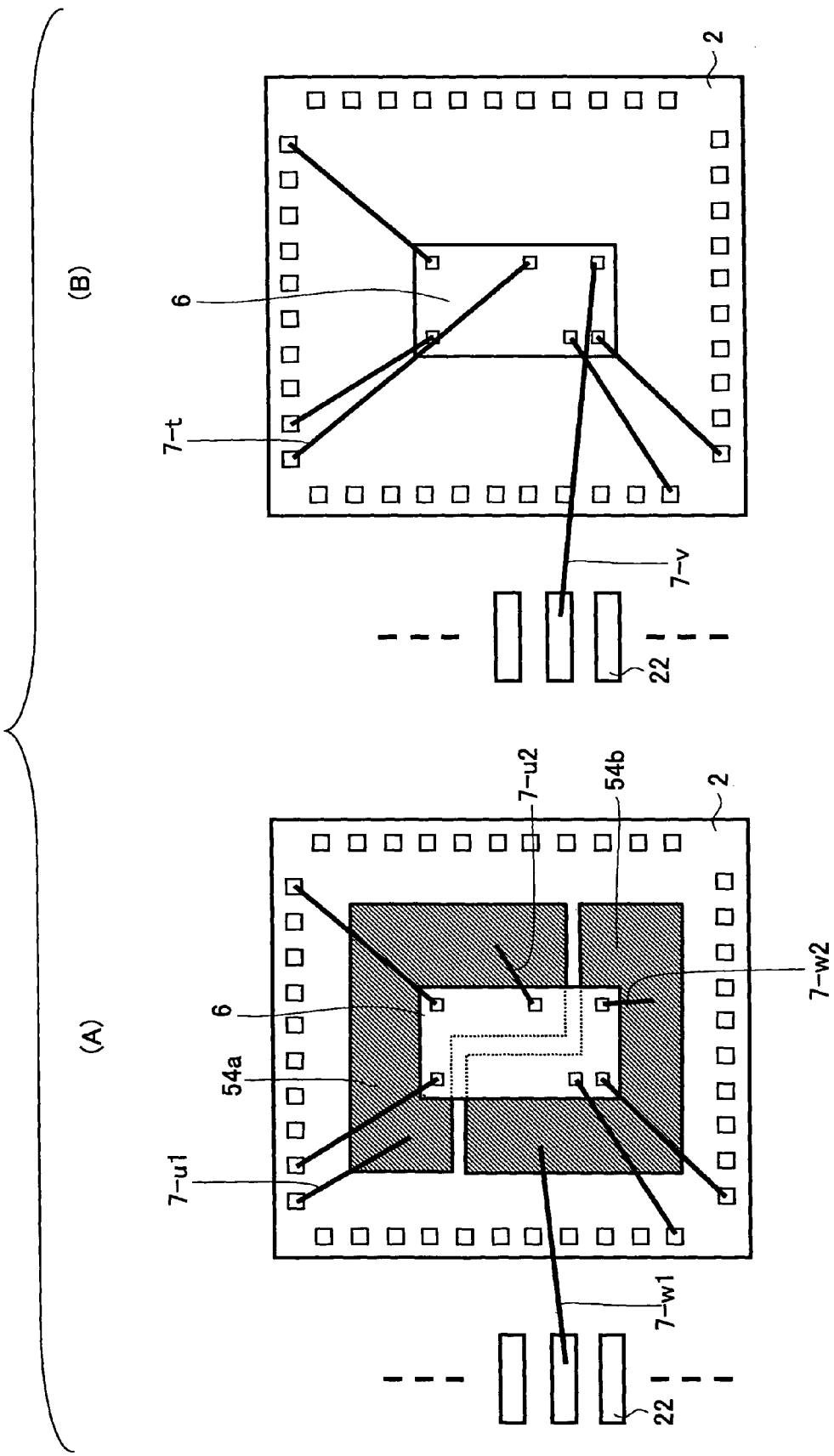
FIG. 19 is a cross-sectional view of a third modified example of the relay board of the second embodiment of the present invention.

In the example shown in FIG. 19-(A), plural relay boards 54a and 54b whose main surfaces have substantially L-shaped configurations are adhered and fixed on the first semiconductor chip 2. The relay boards 54a and 54b are independently adhered and fixed on the first semiconductor chip 2 with a small gap therebetween. The entire main surfaces (upper surfaces) of the relay boards 54a and 54b are continuous conductive surfaces. The second semiconductor chip 6 is provided on parts of the relay boards 54a and 54b.

As shown in FIG. 19-(B), in a case where the relay boards 54a and 54b are not provided between the first semiconductor chip 2 and the second semiconductor chip 6, the lengths of bonding wires 7-t and 7-v connecting the first semiconductor chip 2 and the second semiconductor chip 6 are long and the neighboring bonding wires cross each other.

However, as shown in FIG. 19-(A), in a case where the relay boards 54a and 54b are provided between the first semiconductor chip 2 and the second semiconductor chip 6, the connection by the bonding wire 7-t can be achieved in FIG. 19-(A) by the connection by the short bonding wires 7-u1 and 7-u2 via the relay board 54a, and the connection by the bonding wire 7-v can be achieved in FIG. 19-(A) by the connection by the short bonding wires 7-w1 and 7-w2 via the relay board 54b, so that the wire length of the bonding wire can be shortened and crossing of the neighboring bonding wires can be avoided.

Figure 20:
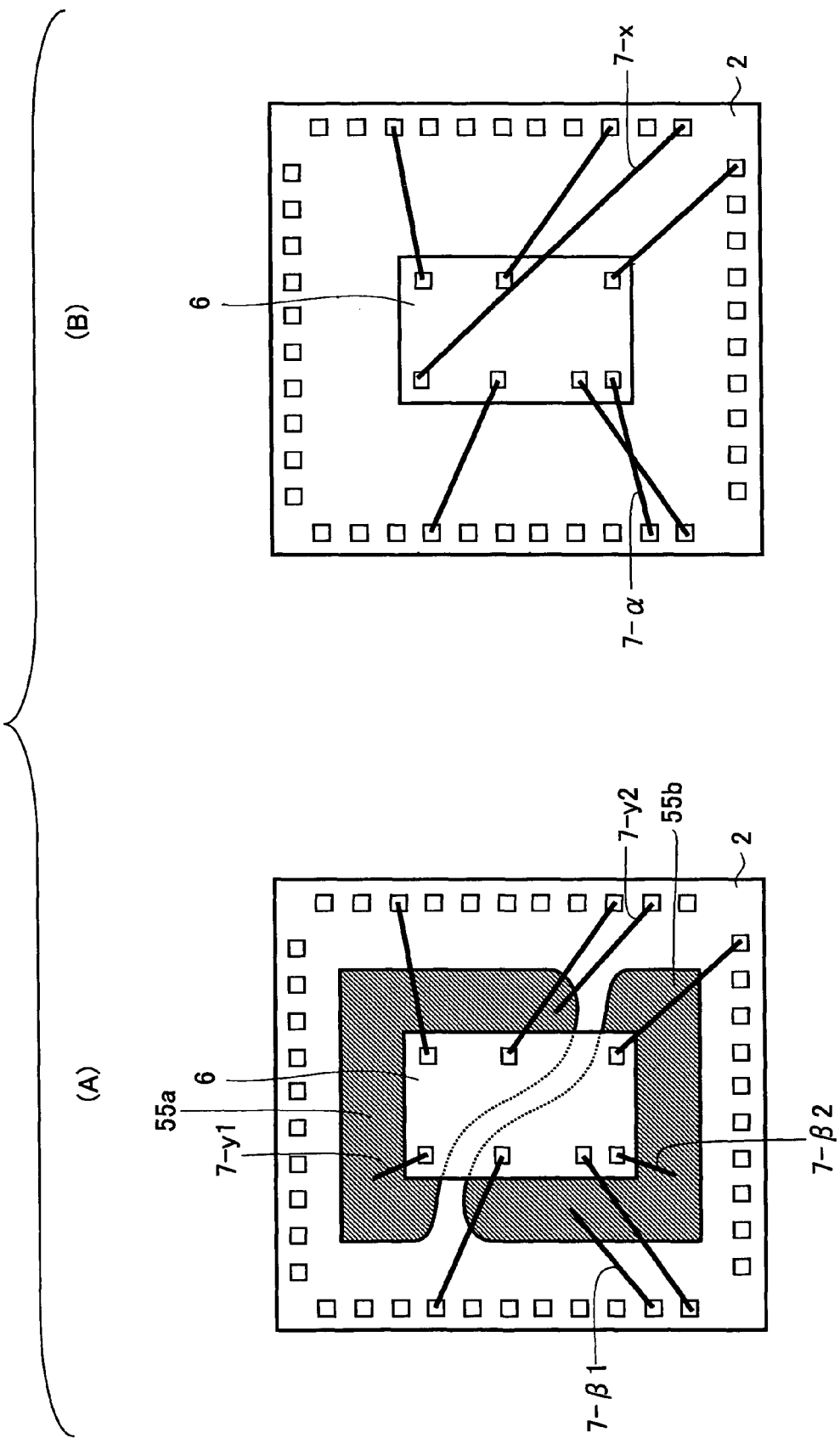
FIG. 20 is a cross-sectional view of a fourth modified example of the relay board of the second embodiment of the present invention.

In the example shown in FIG. 20-(A), plural relay boards 55a and 55b whose main surfaces have a structure where curved parts are formed at parts of external periphery are adhered and fixed on the first semiconductor chip 2. The relay boards 55a and 55b are independently adhered and fixed on the first semiconductor chip 2 with a small gap therebetween. The entire main surfaces (upper surfaces) of the relay boards 55a and 55b are continuous conductive surfaces. The second semiconductor chip 6 is provided on parts of the relay boards 55a and 55b.

As shown in FIG. 20-(B), in a case where the relay boards 55a and 55b are not provided between the first semiconductor chip 2 and the second semiconductor chip 6, the lengths of bonding wires 7-x and 7-α connecting the first semiconductor chip 2 and the second semiconductor chip 6 are long and the neighboring bonding wires cross each other.

However, as shown in FIG. 20-(A), in a case where the relay boards 55a and 55b are provided between the first semiconductor chip 2 and the second semiconductor chip 6, the connection by the bonding wire 7-x can be achieved in FIG. 20-(A) by the connection by the short bonding wires 7-y1 and 7-y2 via the relay board 55a, and the connection by the bonding wire 7-α can be achieved in FIG. 20-(A) by the connection by the short bonding wires 7-β1 and 7-β2 via the relay board 55b, so that the wire length of the bonding wire can be shortened and crossing of the neighboring bonding wires can be avoided.

The relay boards shown in FIG. 17 through FIG. 20 can be formed by dividing a single relay board into plural relay boards by dicing with a blade, laser processing, an etching process, or the like. Especially, by using the laser process, the relay board whose main surface has a substantially L-shaped configuration shown in FIG. 19 or the relay board whose main surface has a curved part formed at a part of the external periphery shown in FIG. 20 can be easily formed.

In addition, the internal structures of the relay boards shown in FIG. 17 through FIG. 20 may be the structure shown in FIG. 4, FIG. 6 or FIG. 7. The main surface of the relay board may have the structure shown in FIG. 8 through FIG. 12.

Thus, in this embodiment of the present invention, plural relay boards are adhered and fixed on the first semiconductor chip 2. The relay boards are independently adhered and fixed on the first semiconductor chip 2 in parallel with a small gap therebetween. The second semiconductor chip 6 is provided on the parts of the plural relay boards. Hence, it is possible to increase the number of terminals for connecting the first semiconductor chip 2 and the second semiconductor chip 6. Therefore, it is possible to relay the bonding wires of the first semiconductor chip 2 and the second semiconductor chip 6 at different electrical potentials.

While the same effect as the effect achieved by the first embodiment of the present invention can be achieved in the second embodiment, in the second embodiment, as compared with the first embodiment, the degree of design freedom at the connection and the arrangement of the first semiconductor chip 2, the second semiconductor chip 6, and the inner lead 22 can be improved.

Hence, it is possible to avoid the crossing of the bonding wires more effectively and shorten the wire length of the bonding wires 7. Therefore, it is possible to further improve the manufacturing yield rate of the semiconductor device 10 and the height of a wire loop of the bonding wire 7 can be made short. Accordingly, it is possible to reduce the height of the semiconductor device 10 so that the semiconductor device 10 can be made thin.

Third Embodiment

Next, a third embodiment of the present invention is discussed. In the following description, parts that are the same as the parts shown in FIG. 14 are given the same reference numerals, and explanation thereof is omitted.

Figure 21:
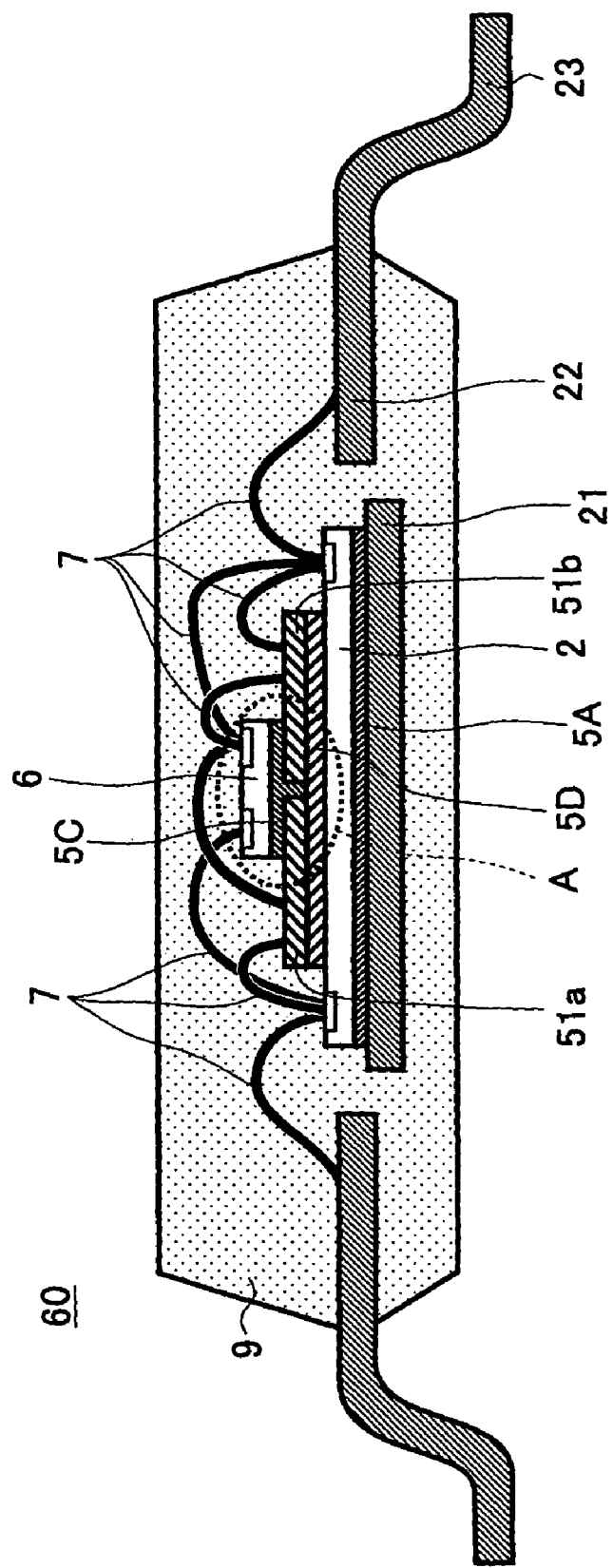
FIG. 21 is a cross-sectional view of a semiconductor device having a relay board of a third embodiment of the present invention.
Figure 22:
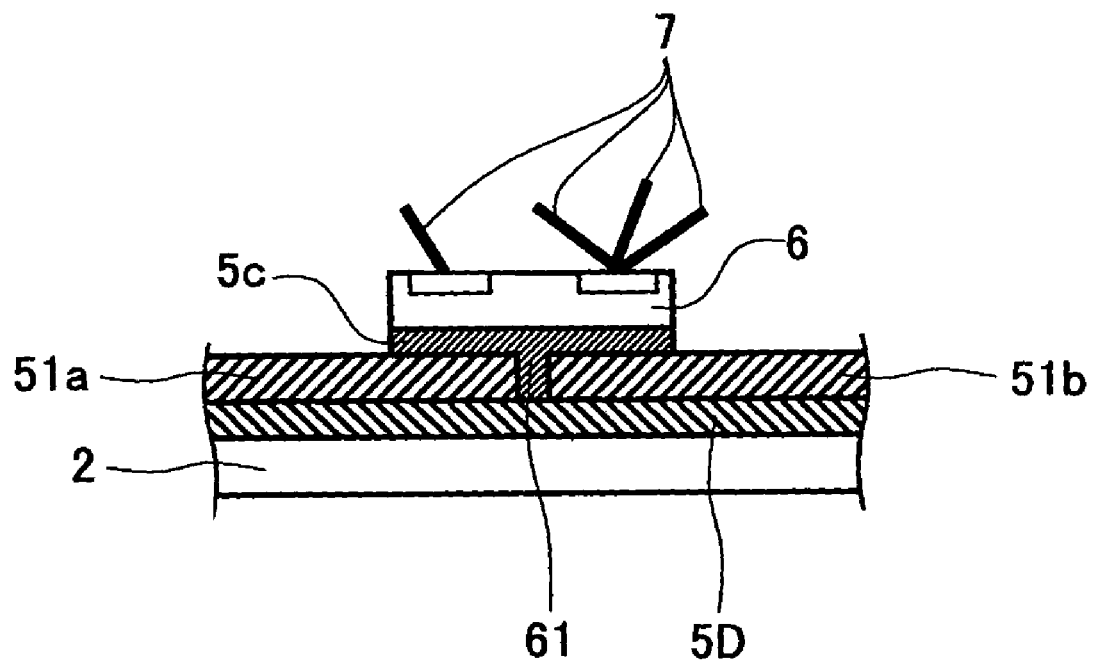
FIG. 22 is an expanded view of a part surrounded by a dotted line A in FIG. 21.

FIG. 21 is a cross-sectional view of a semiconductor device having a relay board of a third embodiment of the present invention. FIG. 22 is an expanded view of a part surrounded by a dotted line A in FIG. 21.

In the above-discussed second embodiment of the present invention, plural relay boards 51a and 51b whose main surfaces are smaller than the main surface of the first semiconductor chip 2 are adhered and fixed on the first semiconductor chip 2 via the adhesive 5B. The relay boards 51a and 51b are independently adhered and fixed on the first semiconductor chip 2 in parallel with a small gap therebetween. The second semiconductor chip 6 is adhered and fixed on the parts of the relay boards 51a and 51b via the adhesive 5C.

On the other hand, in the third embodiment of the present invention, plural relay boards 51a and 51b whose main surfaces are smaller than the main surface of the first semiconductor chip 2 are adhered and fixed on the first semiconductor chip 2 via a common single film adhesive 5D. The relay boards 51a and 51b are independently adhered and fixed on the first semiconductor chip 2 in parallel with a small gap therebetween. The second semiconductor chip 6 is adhered and fixed on the parts of the relay boards 51a and 51b via the adhesive 5C.

Under this structure, in the manufacturing process of the semiconductor device 10, plural relay boards 51a and 51b can be provided on the first semiconductor chip 2 at the same time. Hence, it is possible to improve the productivity of the semiconductor device 10 so that the semiconductor device 10 can be manufactured at low cost. In addition, it is possible to improve precision of the relative position between the relay boards 51a and 51b so that the manufacturing yield rate can be improved.

In addition, since a gap part formed by separating the relay boards 51a and 51b from each other is filled with the adhesive 5C, a space area of the gap between the relay boards 51a and 51b is made small. Therefore, it is possible to easily apply the adhesive 5C for adhering the second semiconductor chip 2 into the gap 61 at a part where the second semiconductor chip 6 is provided.

Hence, adhesion of the second semiconductor chip 6 to the relay boards 51a and 51b is improved and therefore the reliability of the semiconductor device is improved.

Of course, in the third embodiment, it is possible to achieve the same effect as the effect achieved by the first and second embodiments of the present invention.

In addition, the internal structures of the relay boards 51a and 51b may be as shown in FIG. 4, FIG. 6 or FIG. 7. The main surface of the relay board may be as shown in FIG. 8 through FIG. 12.

Fourth Embodiment

Next, a fourth embodiment of the present invention is discussed. In the following description, parts that are the same as the parts shown in FIG. 1 through FIG. 22 are given the same reference numerals, and explanation thereof is omitted.

Figure 23:
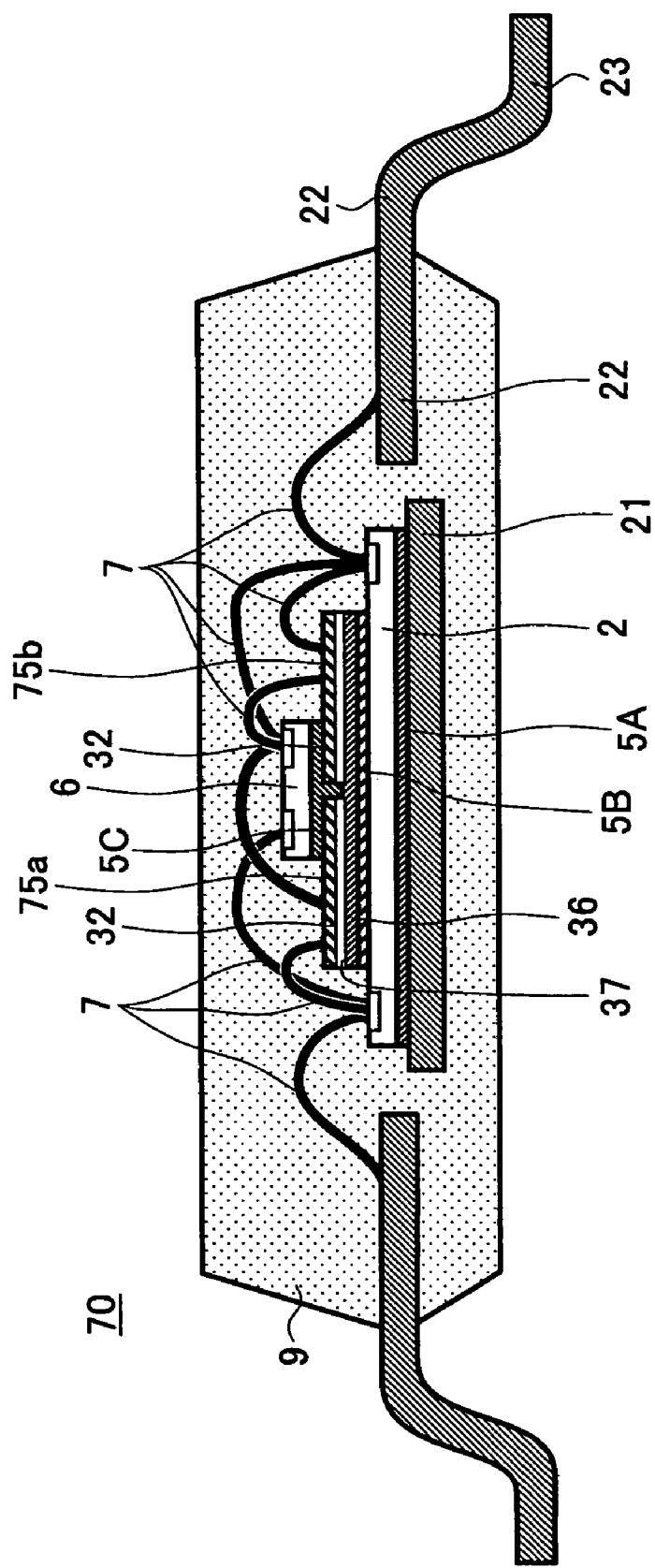
FIG. 23 is a cross-sectional view of a semiconductor device having a relay board of a fourth embodiment of the present invention.
Figure 24:
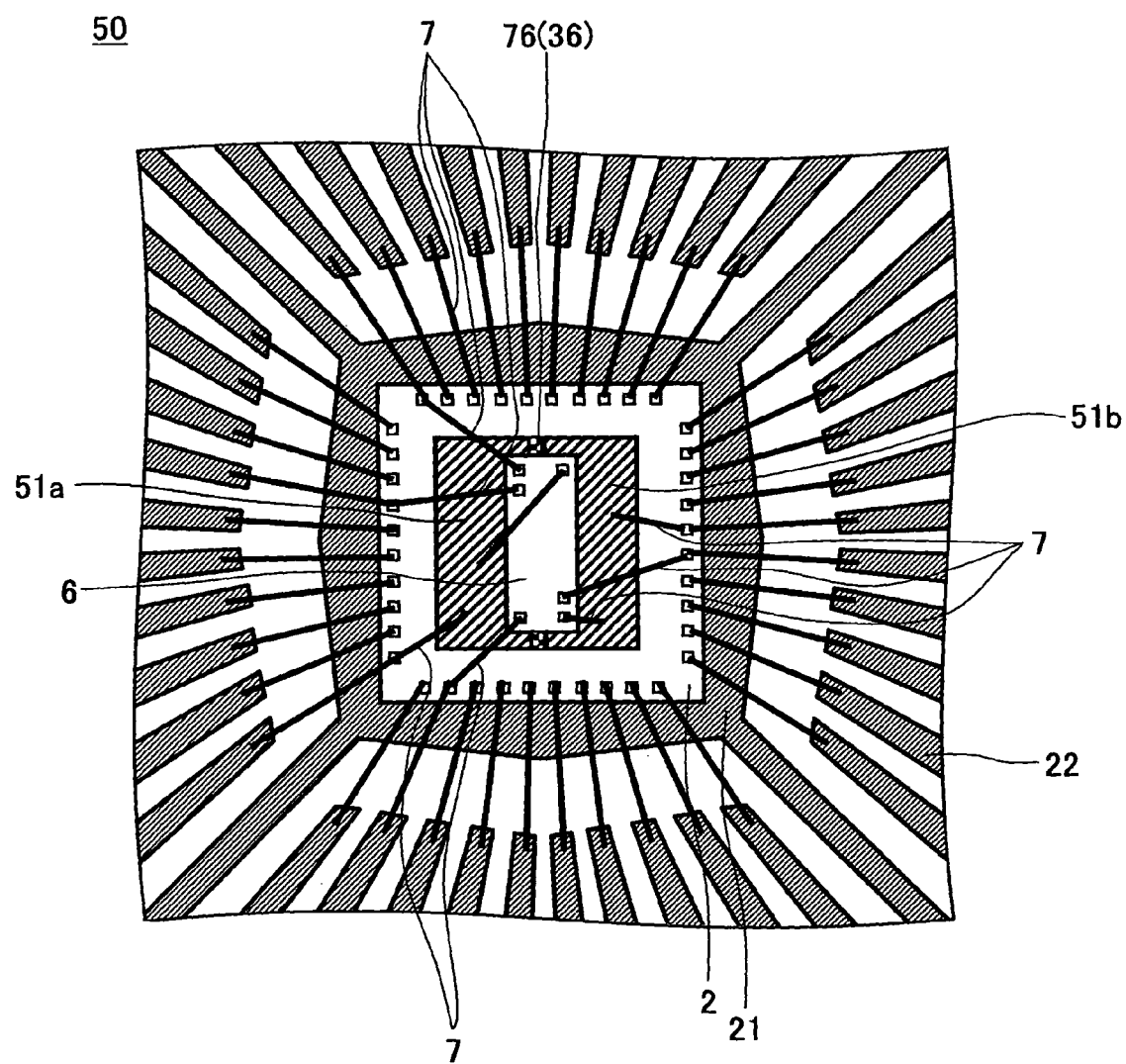
FIG. 24 is a partially expanded view of the semiconductor device shown in FIG. 23.
Figure 25:
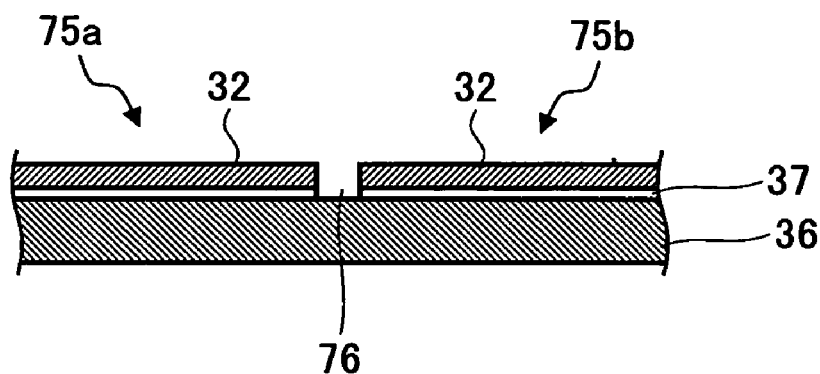
FIG. 25 is a partially expanded cross-sectional view of a relay board of a fourth embodiment of the present invention.
Figure 26:
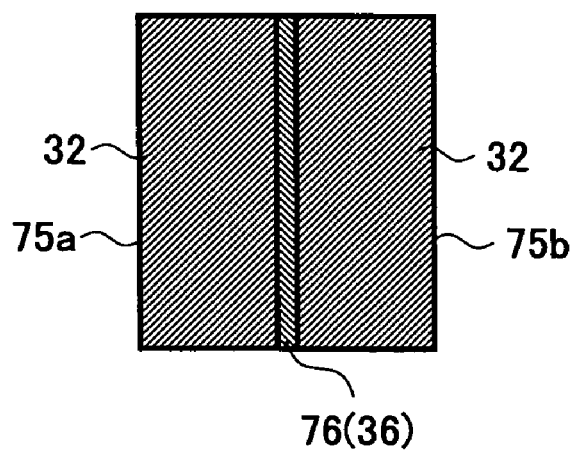
FIG. 26 is a plan view of the relay board of the fourth embodiment of the present invention.

FIG. 23 is a cross-sectional view of a semiconductor device having a relay board of a fourth embodiment of the present invention. FIG. 24 is a partially expanded view of the semiconductor device shown in FIG. 23. In FIG. 24, illustration of the sealing resin 9 is omitted. FIG. 25 is a partially expanded cross-sectional view of a relay board of a fourth embodiment of the present invention. FIG. 26 is a plan view of the relay board of the fourth embodiment of the present invention.

In the above-discussed second embodiment of the present invention, plural relay boards 51a and 51b whose main surfaces are smaller than the main surface of the first semiconductor chip 2 are adhered and fixed on the first semiconductor chip 2 via the adhesive 5B. The relay boards 51a and 51b are independently adhered and fixed on the first semiconductor chip 2 in parallel with a small gap. The second semiconductor chip 6 is adhered and fixed on the parts of the relay boards 51a and 51b via the adhesive 5C.

On the other hand, in the fourth embodiment of the present invention, as shown in FIG. 23 through FIG. 25, the relay board 75 provided on the main surface of the first semiconductor chip 2 has the same structure as discussed with reference to FIG. 7, namely a structure where an insulation layer 37 is provided on the substrate and the conductive body 32 is provided on the insulation layer 37.

In addition, as shown in FIG. 26, a groove 76 is formed in a part other than the substrate 36, namely the conductive body 32 and the insulation layer 37, so that the conductive body 32 and the insulation layer 37 are divided into two areas 75a and 75b. In a state where the second semiconductor chip (See FIG. 23) is not provided on the relay board 75, the substrate 36 is exposed via the groove 76.

As shown in FIG. 23, the second semiconductor chip 6 is provided on the main surface (conductive surface) of the conductive part 32 of the relay board 75 so that the divided areas 75a and 75b of the relay board 75 are bridged.

Thus, in this embodiment, in a single relay board 75, the conductive body 32 is divided into two areas and the second semiconductor chip 6 is mounted on parts of the areas. Hence, the same effect as achieved by the second and third embodiments of the present invention using plural relay boards can be achieved by using only a single relay board 75.

Accordingly, it is possible to increase the number of terminals for connecting the first semiconductor chip 2 and the second semiconductor chip 6. Therefore, it is possible to improve the degree of design freedom in the arrangement of connection among the first semiconductor chip 2, the second semiconductor chip 6, and the inner lead 22. It is not always necessary to divide the insulation layer 37.

In the meantime, forming the groove 76 is not limited to the example shown in FIG. 26. The way of the connection by the bonding wire among the first semiconductor chip 2, the second semiconductor chip 6 and the inner lead 22 and the way of the arrangement of the first semiconductor chip 2, the second semiconductor chip 6 and the inner lead 22 vary. By changing the way of forming the groove 76, it is possible to change how to divide the relay board, namely the configuration of the conductive surface of the relay board so as to correspond to this.

For example, the way of forming the groove 76 may be changed as shown in FIG. 27 through FIG. 30. Here, FIG. 27 through FIG. 30 are cross-sectional views of first through fourth modified example of the relay board of the fourth embodiment of the present invention.

Figure 27:
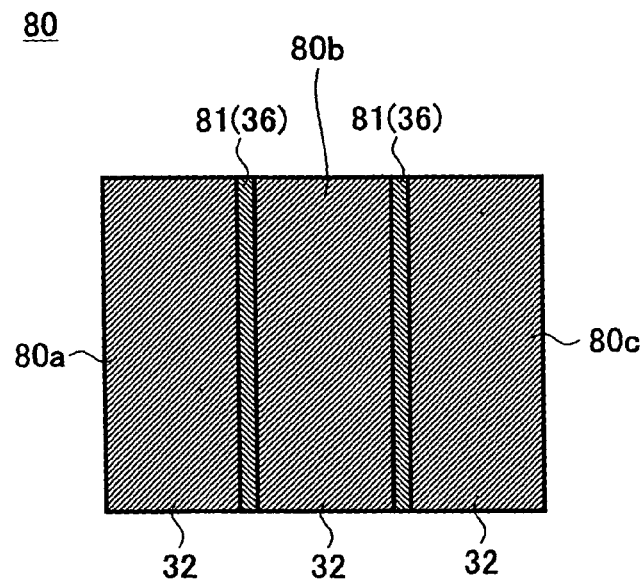
FIG. 27 is a cross-sectional view of a first modified example of the relay board of the fourth embodiment of the present invention.

In the example shown in FIG. 27, two substantially parallel grooves 81 are formed in the relay board 80 so that the conductive part 32 (and the insulation layer 37) is divided into three areas 80a, 80b, and 80c.

Figure 28:
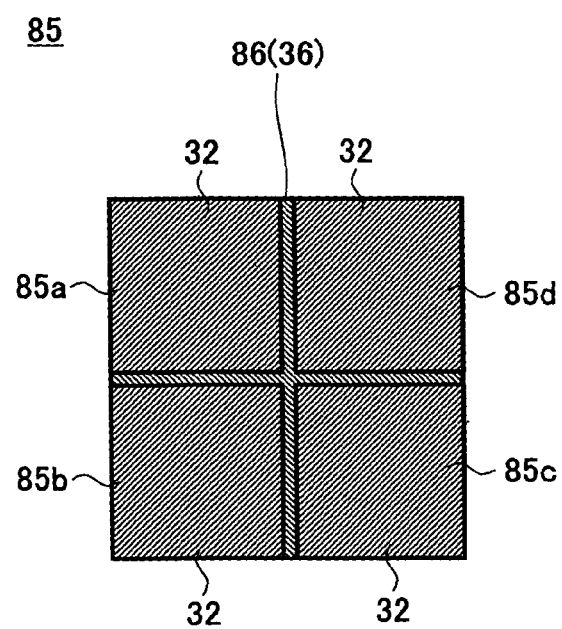
FIG. 28 is a cross-sectional view of a second modified example of the relay board of the fourth embodiment of the present invention.

In the example shown in FIG. 28, two substantially perpendicular grooves 86 are formed in the relay board 80 so that the conductive part 32 (and the insulation layer 37) is divided into four areas 85a, 85b, 85c, and 85d. Main surfaces (conductive surfaces) of the four areas 85a, 85b, 85c, and 85d have substantially square-shaped configurations.

Figure 29:
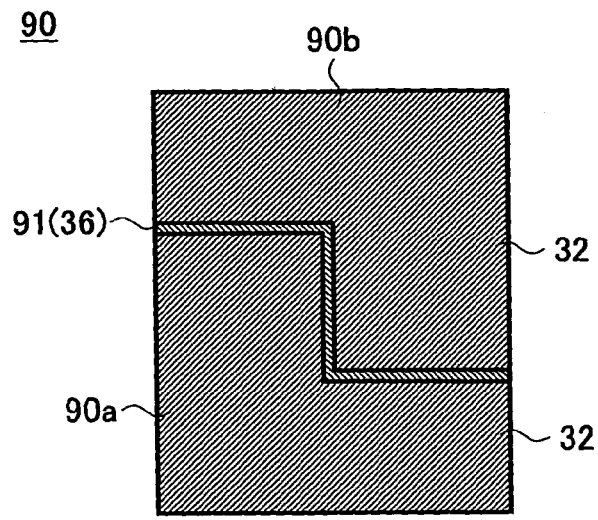
FIG. 29 is a cross-sectional view of a third modified example of the relay board of the fourth embodiment of the present invention.

In the example shown in FIG. 29, a bent-line groove is formed in the relay board 90 so that the conductive part 32 (and the insulation layer 37) is divided into two areas 90a and 90b. Main surfaces (conductive surfaces) of the two areas 90a and 90b have substantially L-shaped configurations.

Figure 30:
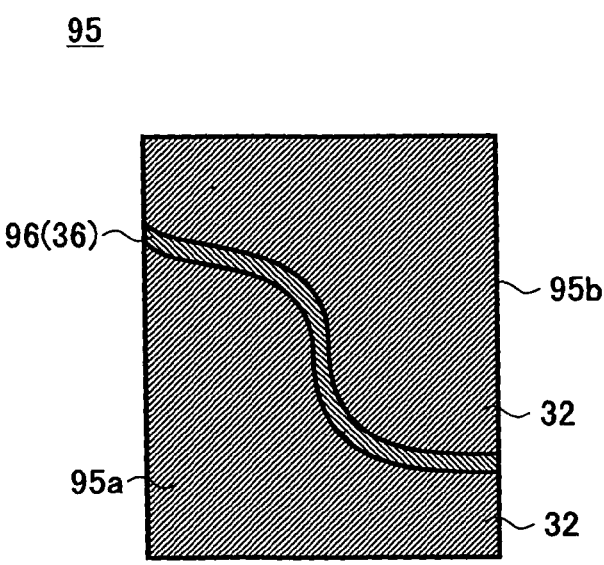
FIG. 30 is a cross-sectional view of a fourth modified example of the relay board of the fourth embodiment of the present invention.

In the example shown in FIG. 30, a curved line groove 96 is formed in the relay board 95 so that the conductive part 32 (and the insulation layer 37) is divided into two areas 95a and 95b.

Forming of the grooves 76, 81, 86, 91 and 96, namely dividing of the relay boards 75, 80, 85, 90, and 95 and the conductive part 32 (and the insulation layer 37), can be done by dicing with a blade, laser processing, etching process, or the like.

Especially, by laser processing, as shown in FIG. 29, the bent-line groove 91 can be easily formed so that main surfaces (conductive surfaces) of the divided two areas have substantially L-shaped configurations. In addition, by laser processing, as shown in FIG. 30, the curved line groove 96 can be easily formed so that main surfaces (conductive surfaces) of the divided two areas have substantially curved parts.

Of course, in the fourth embodiment, it is possible to achieve the same effect as the effect achieved by the first embodiment of the present invention.

In addition, the main surface of the relay board 75 may have the structure shown in FIG. 8 through FIG. 12.

Fifth Embodiment

Next, a fifth embodiment of the present invention is discussed. In the following description, parts that are the same as the parts shown in FIG. 1 through FIG. 30 are given the same reference numerals, and explanation thereof is omitted.

Figure 31:
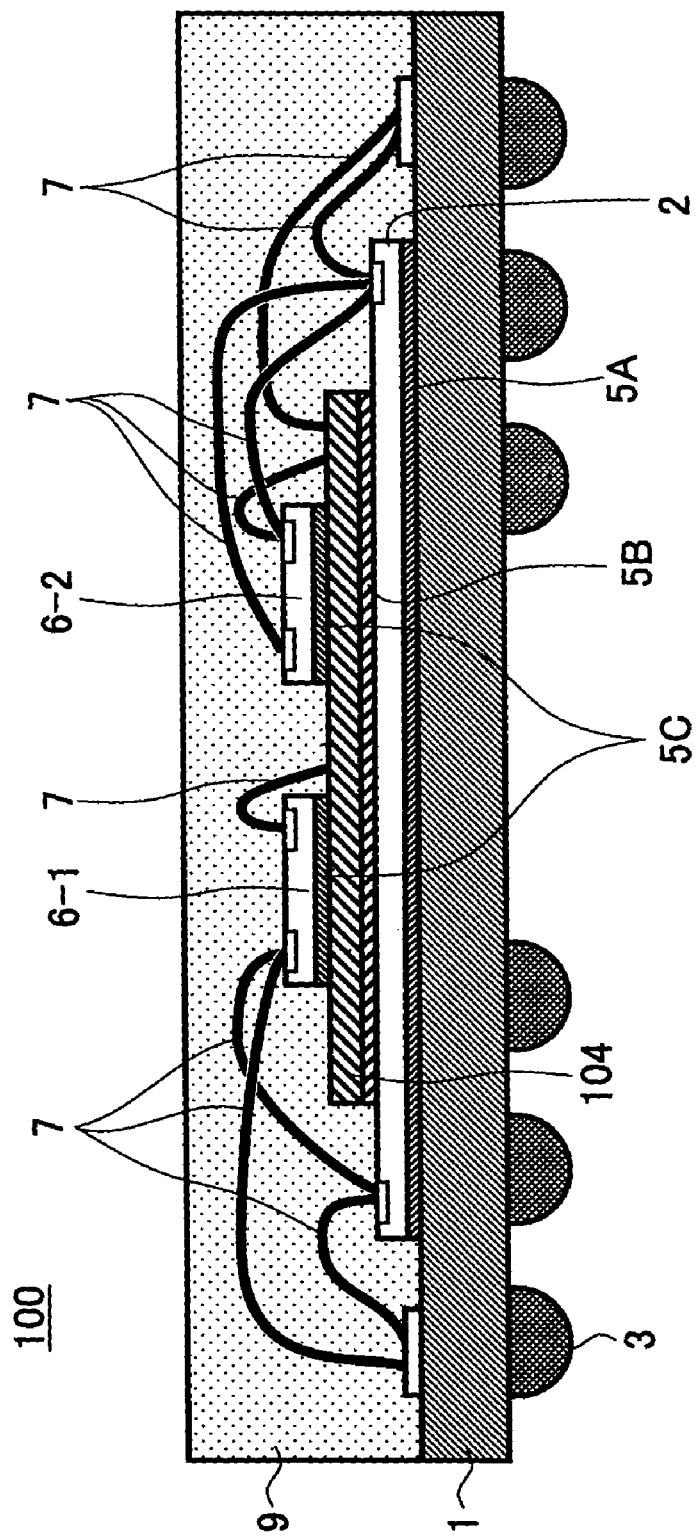
FIG. 31 is a cross-sectional view of a semiconductor device having a relay board of a fifth embodiment of the present invention.
Figure 32:
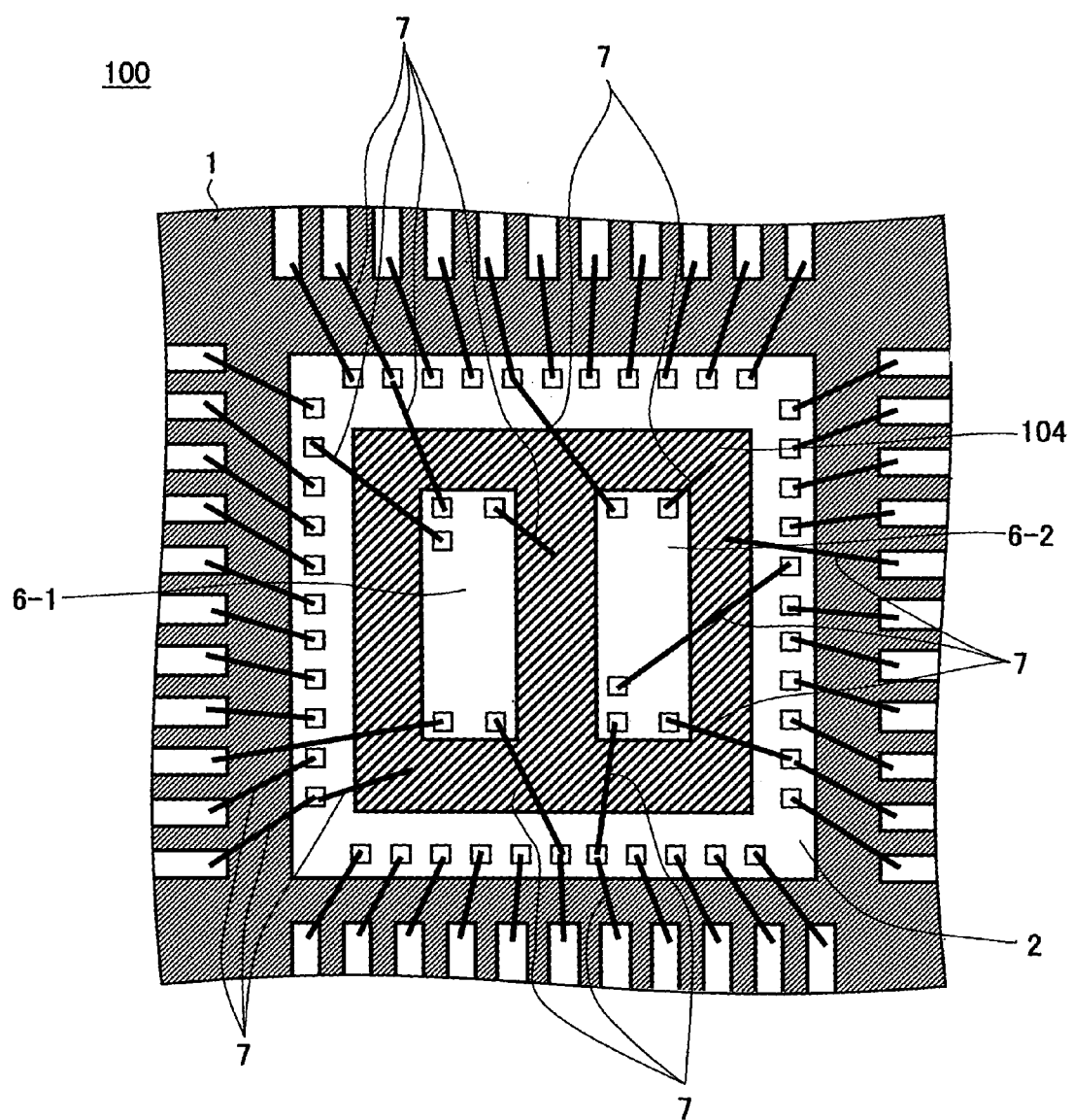
FIG. 32 is a partially expanded view of the semiconductor device shown in FIG. 31.

FIG. 31 is a cross-sectional view of a semiconductor device having a relay board of a fifth embodiment of the present invention. FIG. 32 is a partially expanded view of the semiconductor device shown in FIG. 31. In FIG. 32, illustration of the sealing resin 9 shown in FIG. 31 is omitted.

In the above-discussed second embodiment of the present invention, plural relay boards 51a and 51b whose main surfaces are smaller than the main surface of the first semiconductor chip 2 are adhered and fixed on the first semiconductor chip 2 via the adhesive 5B. The relay boards 51a and 51b are independently adhered and fixed on the first semiconductor chip 2 in parallel with a small gap therebetween. The second semiconductor chip 6 is adhered and fixed on the parts of the relay boards 51a and 51b via the adhesive 5C.

On the other hand, in the fifth embodiment of the present invention, in the semiconductor device where the semiconductor chip is provided on the wiring board, plural second semiconductor chips are provided on the relay board.

Referring to FIG. 31 and FIG. 32, a semiconductor device 100 having a relay board of the fifth embodiment of the present invention is a so-called Ball Grid Array (BGA) package type semiconductor device.

The first semiconductor chip 2 is adhered and fixed on the wiring board 1 via the adhesive 5A. The wiring board 1 has a lower surface where plural spherical-shaped electrodes (bumps) 3 are formed. A relay board 104 whose main surface is smaller than the main surface of the first semiconductor device 2 is adhered and fixed on the first semiconductor device 2 via the adhesive 5B. Plural second semiconductor chips 6-1 and 6-2 whose main surfaces are smaller than the main surface of the relay board 104 are adhered and fixed on the relay board 104 in parallel via the adhesive 5C.

The first semiconductor chip 2 and the relay board 104, the second semiconductor chips 6-1 and 6-2 and the relay board 104, the first semiconductor chip 2 and the second semiconductor chips 6-1 and 6-2, the first semiconductor chip 2 and the wiring board 1, the second semiconductor chips 6-1 and 6-2 and the wiring board 1, and the relay board and the wiring board 1 are respectively connected by the bonding wires 7.

The first semiconductor chip 2, the second semiconductor chips 6-1 and 6-2, the relay board 104, and the bonding wires 7 are sealed by the sealing resin 9.

A printed board made of glass-epoxy, glass-Bismaleimide Triazine (BT), or the like can be used as the wiring board 1. In this case, a multi-layer wiring structure can be easily formed and high density wiring can be formed in the board. Hence, the degree of freedom in design is high. In addition, it is possible to easily correspond to a large number of pins of the semiconductor device.

Furthermore, a flexible tape board made of polyimide film or the like can be used as the wiring board 1. In this case, since minute wiring can be formed, a wiring density in a single wiring layer can be improved so that the number of the wiring layers in the board can be made smaller than that of the printed wiring board. In addition, the semiconductor device can be made thin by reducing the thickness of the film.

Furthermore, an inorganic board made of ceramic, glass, silicon, or the like can be used as the wiring board 1.

Thus, in this embodiment, since plural second semiconductor chips 6-1 and 6-2 are provided on the relay board 104, it is possible to realize multiple functions, large capacities and high densities of the semiconductor device.

However, there is no limitation of the number of the second semiconductor chips 6 provided on the relay board 104. For example, two or more second semiconductor chips 6 may be provided on the relay board 104. By increasing the number of semiconductor chips provided in the semiconductor device, it is possible to realize multiple functions, large capacities and high densities of the semiconductor device.

Of course, in the third embodiment, it is possible to achieve the same effect as achieved by the first embodiment of the present invention.

In addition, the internal structures of the relay boards 51a and 51b may be as shown in FIG. 4, FIG. 6 or FIG. 7. The main surface of the relay board may be as shown in FIG. 8 through FIG. 12.

Sixth Embodiment

Next, a sixth embodiment of the present invention is discussed. In the following description, parts that are the same as the parts shown in FIG. 1 through FIG. 32 are given the same reference numerals, and explanation thereof is omitted.

Figure 33:
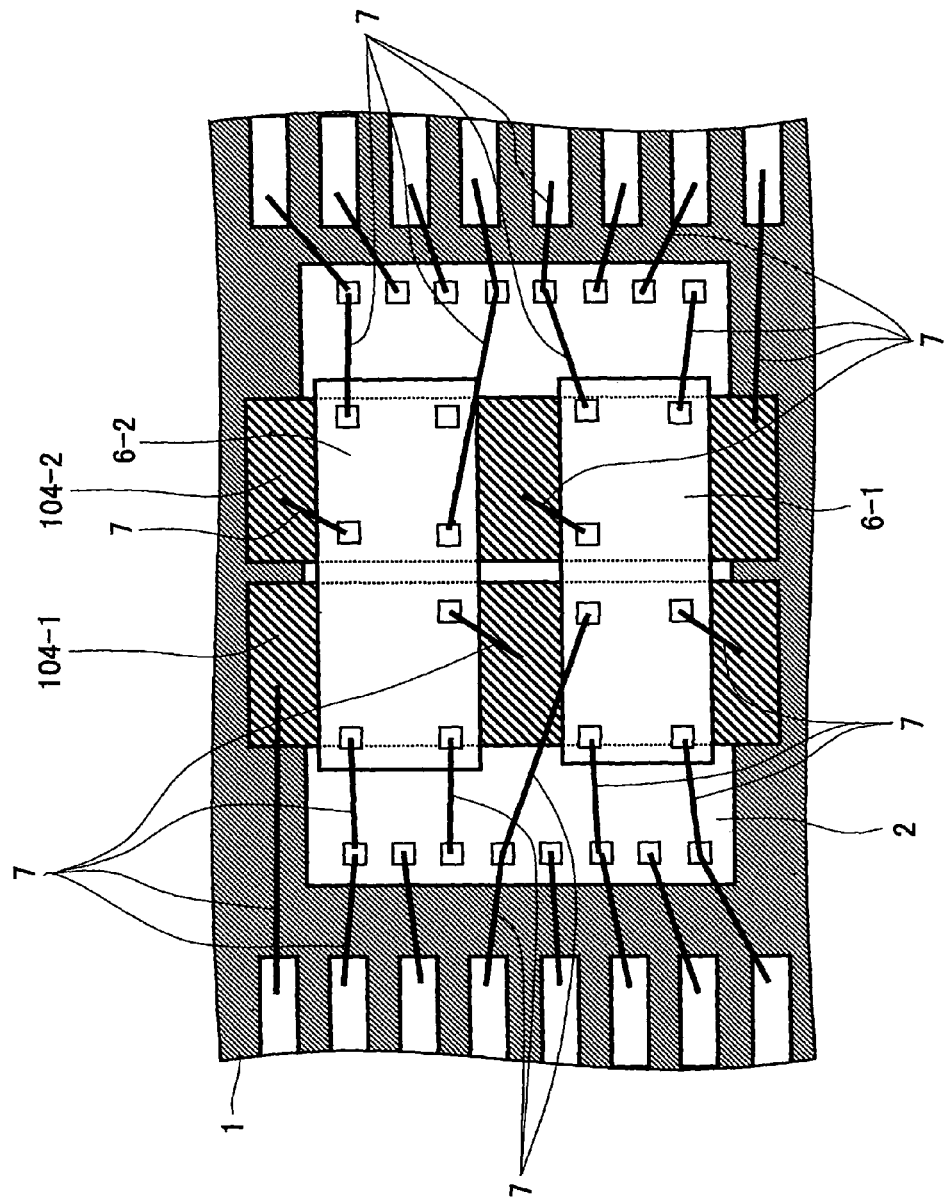
FIG. 33 is a partially expanded plan view of a semiconductor device having a relay board of a sixth embodiment of the present invention.

FIG. 33 is a partially expanded plan view of a semiconductor device having a relay board of a sixth embodiment of the present invention. In FIG. 33, illustration of the sealing resin 9 is omitted.

In the fifth embodiment of the present invention, plural second semiconductor chips are provided on the relay board in the semiconductor device having a structure where the semiconductor chip is provided on the wiring board.

On the other hand, in the sixth embodiment of the present invention, the structures of both second and fifth embodiments are applied. In other words, plural relay boards are provided on the first semiconductor chip and plural second semiconductor chips are provided on parts of the relay boards.

Referring to FIG. 33, relay boards 104-1 and 104-2 are provided in parallel at a designated gap on the first semiconductor chip 2. The second semiconductor chips 6-1 and 6-2 are provided on parts of the relay boards 104-1 and 104-2.

Under this structure, the effect achieved by the second embodiment of the present invention and the effect achieved by the fifth embodiment of the present invention can be achieved in this embodiment. In addition, end parts of long sides of the relay boards 104-1 and 104-2 are projected from the first semiconductor chip 2. Hence, the wire bonding is made at the projection parts so that the degree of design freedom in connection can be improved.

In addition, the internal structures of the relay boards 104-1 and 104-2 may be as shown in FIG. 4, FIG. 6 or FIG. 7. The main surface of the relay board may be as shown in FIG. 8 through FIG. 12.

The way of the arrangement of the relay boards 104-1 and 104-2 may be as in the third embodiment of the present invention. Furthermore, instead of the plural relay boards, a single relay board having divided plural conductive parts as discussed in the fourth embodiment of the present invention can be used.

Seventh Embodiment

Next, a seventh embodiment of the present invention is discussed. In the following description, parts that are the same as the parts shown in FIG. 1 through FIG. 33 are given the same reference numerals, and explanation thereof is omitted.

Figure 34:
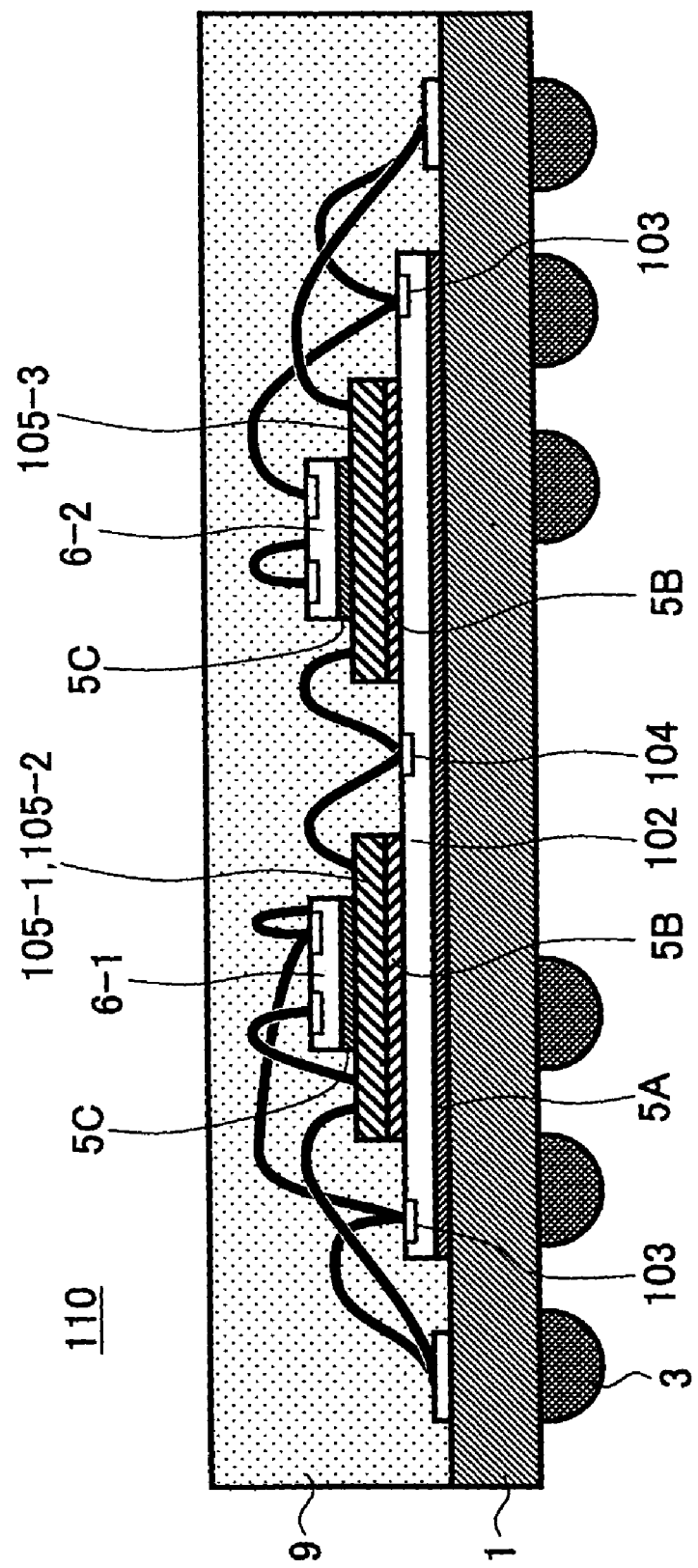
FIG. 34 is a cross-sectional view of a semiconductor device having a relay board of a seventh embodiment of the present invention.
Figure 35:
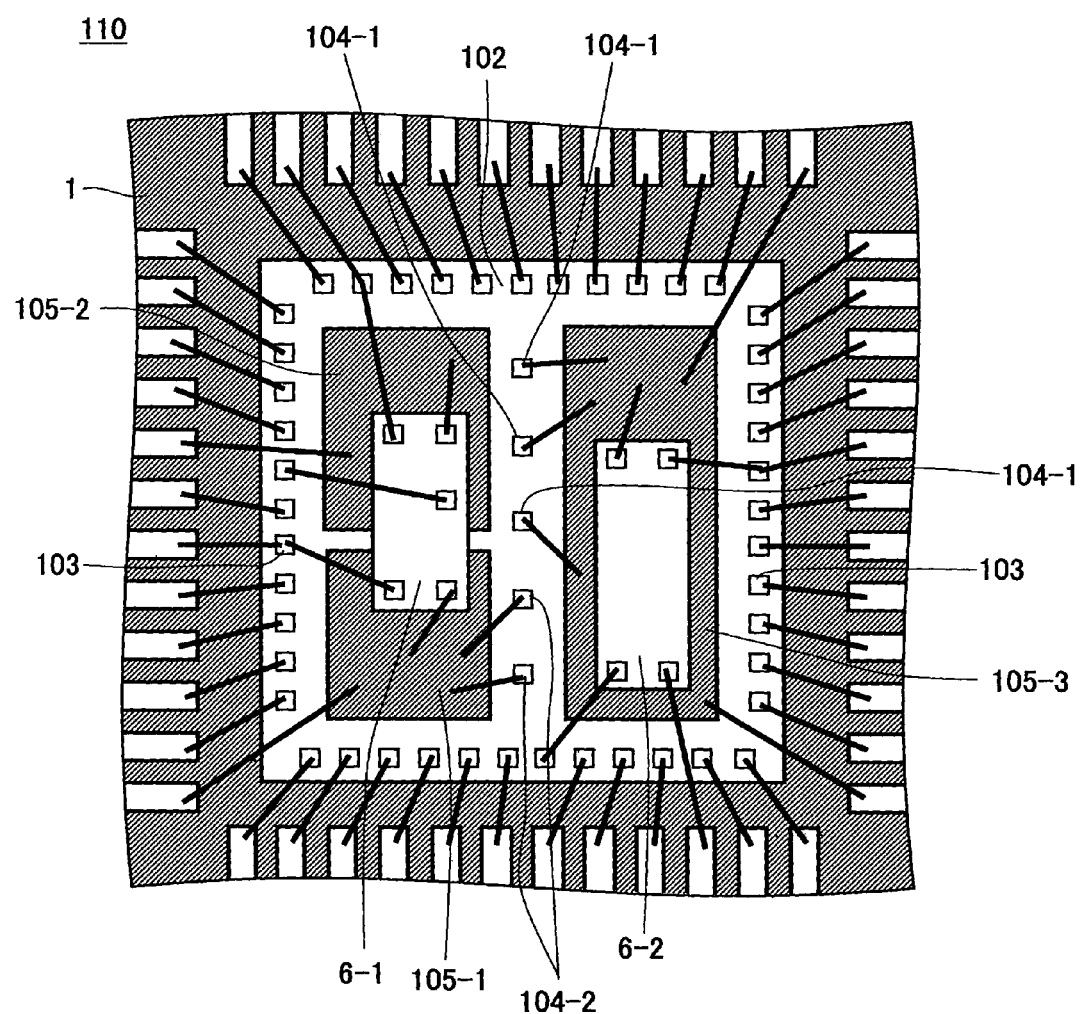
FIG. 35 is a partially expanded view of the semiconductor device shown in FIG. 34.

FIG. 34 is a cross-sectional view of a semiconductor device having a relay board of a seventh embodiment of the present invention. FIG. 35 is a partially expanded view of the semiconductor device shown in FIG. 34. Illustration of the sealing resin 9 is omitted in FIG. 35.

Referring to FIG. 34 and FIG. 35, in a semiconductor device 110 of this embodiment, the first semiconductor chip 102 provided on the wiring board 1 via the adhesive 5A includes plural first electrode pads 103 arranged in lines at periphery edge parts of four sides of the main surface of the first semiconductor chip 102 and plural second electrode pads 104 arranged substantially in the center of the main surface and an area inside of the first electrode pads 103. The second electrode pad 104 is used as an electric power supply electrode being for providing power supply potential.

In an area where the first electrode pad 103 and the second electrode pad 104 are not formed of the main surface of the first semiconductor chip 102, the relay boards 105-1 and 1-5-2 are provided at a left side of the second electrode pad 104 shown in FIG. 35 via the adhesive 5B and the relay board 105-3 is provided at a right side of the second electrode pad 104 shown in FIG. 35 via the adhesive 5B In addition, the second semiconductor chip 6-1 is provided at parts of the relay boards 105-1 and 105-2 via the adhesive 5C. The second semiconductor chip 6-2 whose main surface is smaller than the main surface of the relay board 105-3 is provided on the relay board 105-3 via the adhesive 5c.

The electrodes of the relay boards 105-1 through 105-3 and the electrode of the first semiconductor chip 102, the electrodes of the relay boards 105-1 and 105-2 and the electrode pad of the second semiconductor chip 6-1, the relay board 105-3 and the electrode of the second semiconductor chip 6-2, the electrode of the first semiconductor chip 102 and the second electrode semiconductor chips 6-1 and 6-2, the electrode of the first semiconductor chip 102 and the electrode of the wiring board 1, the electrodes of the second semiconductor chips 6-1 and 6-2 and the electrode of the wiring board 1, and the relay boards 105-1 through 105-3 and the electrode of the wiring board 1 are respectively connected by the bonding wires 7.

Since the second electrode pad 104 of the first semiconductor chip 102 and the relay board 105-2 connecting the second semiconductor chip 6-1 are connected by the bonding wire 7 and the second electrode pad 104 of the first semiconductor chip 102 and the relay board 105-3 connecting the second semiconductor chip 6-2 are connected by the bonding wire 7, voltage drop (IR drop) that may occur in the first semiconductor chip 102 can be easily avoided.

In other words, the voltage drop may happen in a case where the size of the semiconductor chip is large like the first semiconductor chip 102 or in a case where the wiring in the semiconductor chip is complex. However, according to the structure in this embodiment, the electric power can be supplied in a short wiring length. Therefore, it is possible to easily avoid the voltage drop in the first semiconductor chip 102 so that the stability of the operation of the first semiconductor chip 102 can be improved.

In addition, in a structure shown in FIG. 35, by setting the second electrode pads 104-1 and 104-2 to different electric potentials, electric power with different potential can be supplied to internal circuits of the first semiconductor chip 102. Hence, it is possible to form more complex circuit in the first semiconductor chip 102.

Of course, in the seventh embodiment, it is possible to achieve the same effect as achieved by the first embodiment of the present invention.

In addition, the internal structures of the relay boards 105-1 and 105-2 may be as shown in FIG. 4, FIG. 6 or FIG. 7. The main surface of the relay board may have the structure shown in FIG. 8 through FIG. 12.

The way of the arrangement of the relay boards 105-1 and 105-2 may be as in the third embodiment of the present invention. Furthermore, instead of the plural relay boards, a single relay board having divided plural conductive parts as discussed in the fourth embodiment of the present invention can be used.

Eighth Embodiment

Next, an eighth embodiment of the present invention is discussed. In the following description, parts that are the same as the parts shown in FIG. 1 through FIG. 35 are given the same reference numerals, and explanation thereof is omitted.

Figure 36:
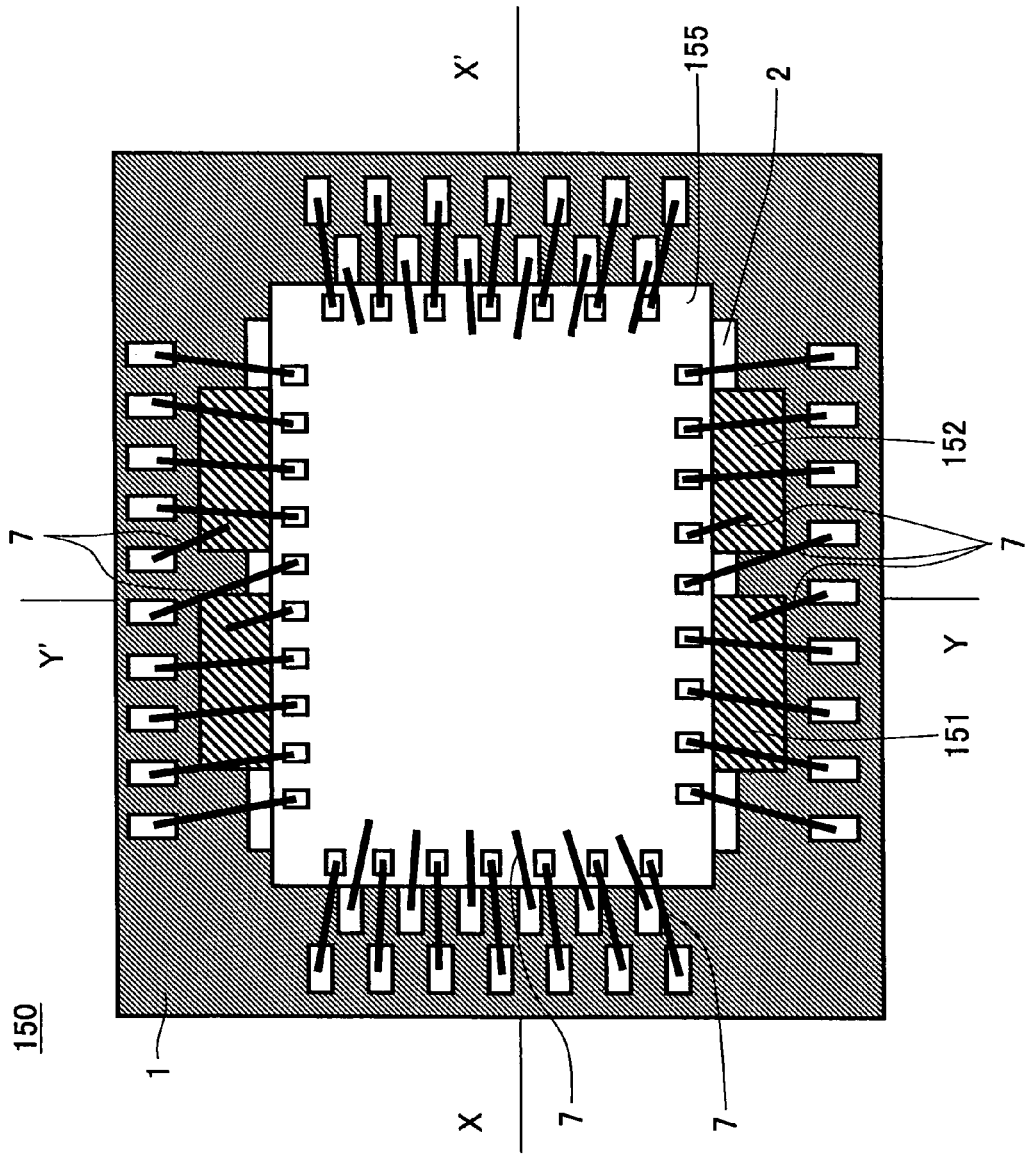
FIG. 36 is a plan view of a semiconductor device having a relay board of a seventh embodiment of the present invention.
Figure 37:
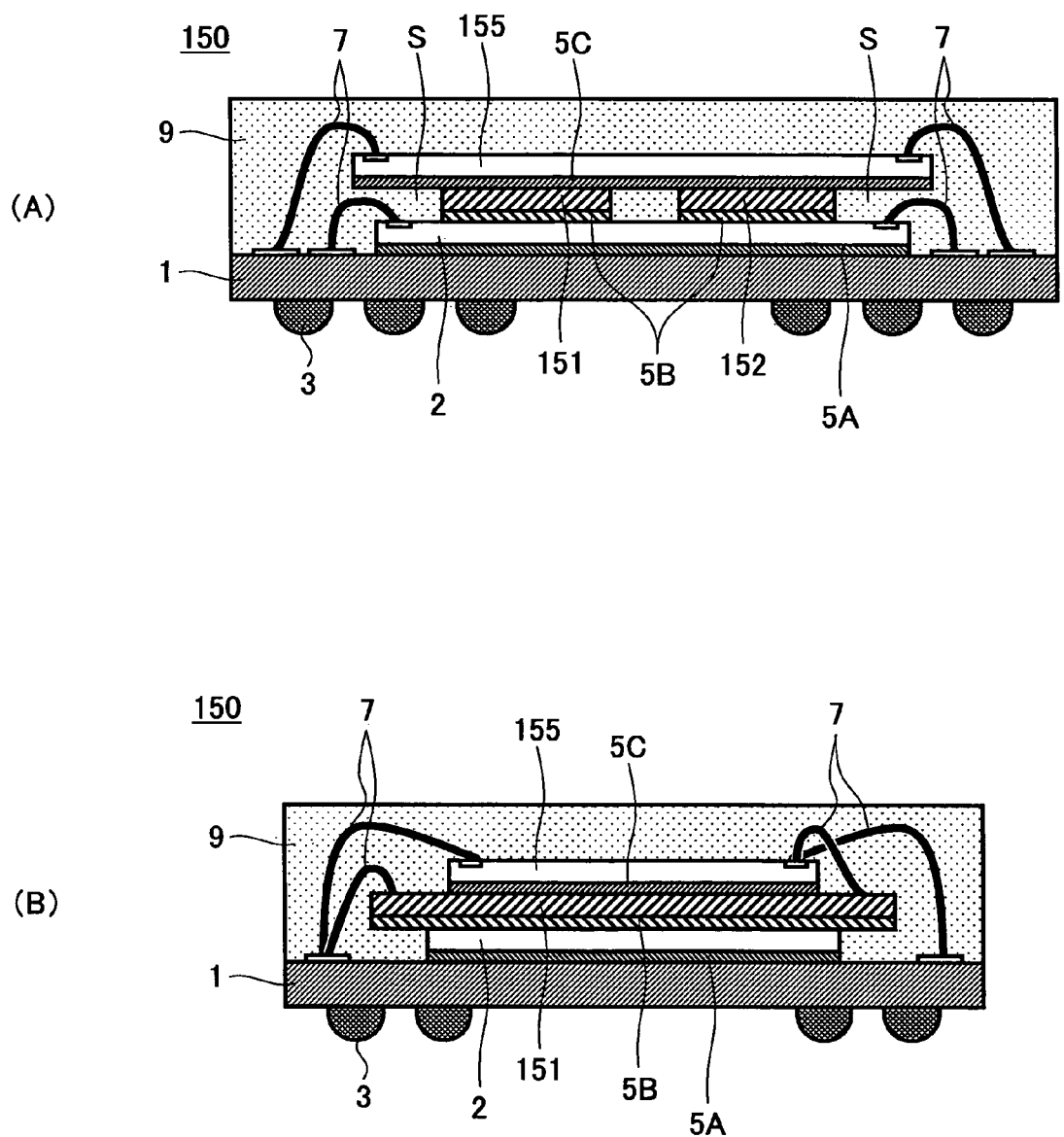
FIG. 37 is a plan view of the semiconductor device shown in FIG. 36.

FIG. 36 is a plan view of a semiconductor device having a relay board of a seventh embodiment of the present invention. FIG. 37 is a plan view of the semiconductor device shown in FIG. 36. FIG. 37-(A) is a cross-sectional view taken along line X-X' in FIG. 36. FIG. 37-(B) is a cross-sectional view taken along line Y-Y' in FIG. 36. Illustration of the sealing resin 9 shown in FIG. 37 is omitted in FIG. 36.

Referring to FIG. 36 and FIG. 37, in the semiconductor device 150, the first semiconductor chip 2 is adhered and fixed on the wiring board 1 via the adhesive 5A. The relay boards 151 and 152 are adhered and fixed on the first semiconductor chip 2 in parallel with a designated gap via the adhesive 5B. In addition, the second semiconductor chip 155 is adhered and fixed on the relay boards 151 and 152 via the adhesive 5C.

Under this structure, the length in the X-X' direction (See FIG. 36) of the relay boards 151 and 152 is shorter than the length in the X-X' direction of the first semiconductor chip 2 and the second semiconductor chip 155 as shown in FIG. 37-(A). On the other hand, the length in the Y-Y' direction (See FIG. 36) of the relay boards 151 and 152 is longer than the length in the Y-Y' direction of the first semiconductor chip 2 and the second semiconductor chip 155 as shown in FIG. 37-(B).

Therefore, as shown in FIG. 37-(B), the vicinity of the end parts in the Y-Y' direction of the relay boards 151 and 152 is connected to the wiring board 1 and the second semiconductor chip 155 by the bonding wires 7.

On the other hands, as shown in FIG. 37-(A), the relay boards 151 and 152 form a space S between the first semiconductor chip 2 and the second semiconductor chip 155.

More specifically, the relay boards 151 and 152 provided between the first semiconductor chip 2 and the second semiconductor chip 155 are positioned so as to not overlap the electrode pad situated in the vicinity of the end part in the X-X' direction of the first semiconductor chip 2 shown in FIG. 37-(A). The second semiconductor chip 152 is provided above the first semiconductor chip 2 with a designated gap so as to overlap the electrode pad situated in the vicinity of the end part in the X-X' direction of the first semiconductor chip 2.

Under this structure, as shown in FIG. 37-(A), the second semiconductor chip 155 and the wiring board 1 are connected by the bonding wire 7. The first semiconductor chip 2 and the wiring board 4 are connected by the bonding wire 7.

Thus, the relay boards 151 and 152 form the space S between the first semiconductor chip 2 and the second semiconductor chip 155. Therefore, the first semiconductor chip 2 and the wiring board 1 can be connected without the bonding wire 7 coming in contact with the second semiconductor chip 15 situated above the bonding wire 7.

Of course, in the seventh embodiment, it is possible to achieve the same effect as achieved by the first embodiment of the present invention.

In addition, the internal structures of the relay boards 151 and 152 may be as shown in FIG. 4, FIG. 6 or FIG. 7. The main surface of the relay board may have the structure shown in FIG. 8 through FIG. 12.

The way of the arrangement of the relay boards 151 and 152 may be as in the third embodiment of the present invention. Furthermore, instead of the plural relay boards, a single relay board having divided plural conductive parts as discussed in the fourth embodiment of the present invention can be used.

Ninth Embodiment

Next, a ninth embodiment of the present invention is discussed. In the following description, parts that are the same as the parts shown in FIG. 1 through FIG. 37 are given the same reference numerals, and explanation thereof is omitted.

Figure 38:
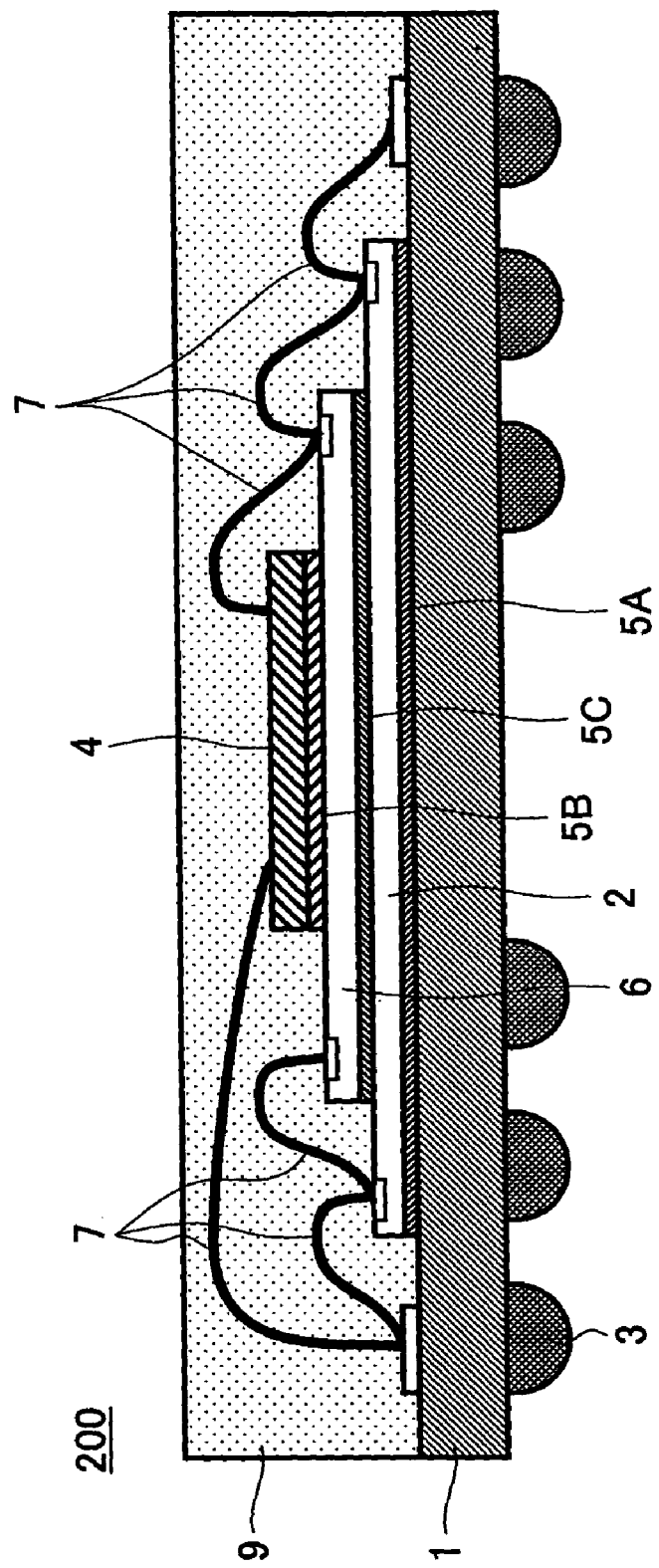
FIG. 38 is a cross-sectional view of a semiconductor device having a relay board of a ninth embodiment of the present invention.
Figure 39:
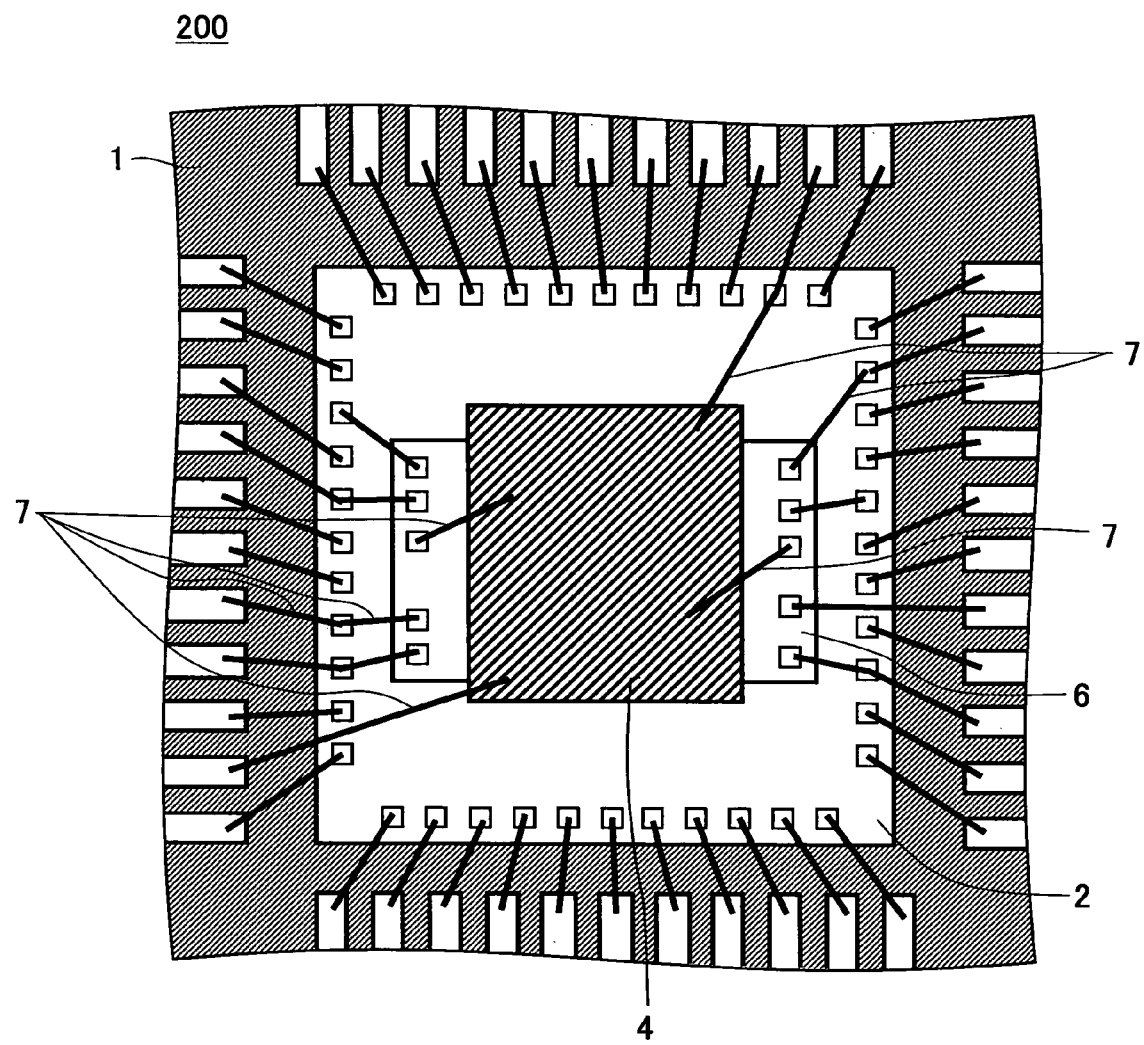
FIG. 39 is a partially expanded view of the semiconductor device shown in FIG. 38.

FIG. 38 is a cross-sectional view of a semiconductor device having a relay board of a ninth embodiment of the present invention. FIG. 39 is a partially expanded view of the semiconductor device shown in FIG. 38. Illustration of the sealing resin 9 shown in FIG. 38 is omitted in FIG. 39.

In the above-discussed embodiments of the present invention, the relay board 4 is provided between the first semiconductor chip 4 and the second semiconductor chip 6.

On the other hand, in the ninth embodiment of the present invention, the second semiconductor chip 6 is provided on the first semiconductor chip 2. The relay board 4 is provided on the second semiconductor chip 6.

In other words, referring to FIG. 38 and FIG. 39, the first semiconductor chip 2 is mounted on the wiring board 1 via the adhesive 5A. The second semiconductor chip 6 whose main surface is smaller than the main surface of the first semiconductor chip 2 is adhered and fixed on the first semiconductor chip 2. The relay board 4 is adhered and fixed on the second semiconductor chip 6 via the adhesive 5B.

The relay board 4 and the electrode of the first semiconductor chip 2, the relay board 4 and the electrode of the second semiconductor chip 6, the electrode of the first semiconductor chip 2 and the electrode of the second semiconductor chip 6, the electrode of the first semiconductor chip 2 and the electrode of the wiring board 1, the electrode of the second semiconductor chip 6 and the electrode of the wiring board 1, and the relay board 4 and the electrode of the wiring board 1 are respectively connected by the bonding wires 7.

The first semiconductor chip 2, the second semiconductor chip 6, the relay board 4, and the bonding wire 7 are sealed by the sealing resin 9.

In the ninth embodiment of the present invention, the entire main surface (upper surface) of the relay board 4, which is a conductive surface, is exposed before being sealed by the sealing resin 9. Therefore, as compared with a case where the relay board 4 is provided between the first semiconductor chip 2 and the second semiconductor chip 6, in this embodiment, it is possible to make an area where wire bonding can be made in the main surface of the relay board 4 wide. Accordingly, the degree of design freedom of the connection by the bonding wire can be improved. Especially, this effect is useful when the difference of sizes of the first semiconductor chip 2 and the second semiconductor chip 6 is small.

In this embodiment, as discussed above, the exposed entire main surface (upper surface) of the relay board 4, which is a conductive surface, is exposed before being sealed by the sealing resin 9. Therefore, the sealing resin 9 may be removed from the main surface of the relay board 4 at an interface. However, this problem can be solved by, for example, forming the resin film with a designated opening part on the main surface of the relay board 4 as shown in FIG. 8 through FIG. 12 and making wire-bonding only in the opening part.

Of course, in the seventh embodiment, it is possible to achieve the same effect as achieved by the first embodiment of the present invention.

In addition, the internal structure of the relay board 4 may be as shown in FIG. 4, FIG. 6 or FIG. 7.

Tenth Embodiment

Next, a tenth embodiment of the present invention is discussed. In the following description, parts that are the same as the parts shown in FIG. 1 through FIG. 39 are given the same reference numerals, and explanation thereof is omitted.

Figure 40:
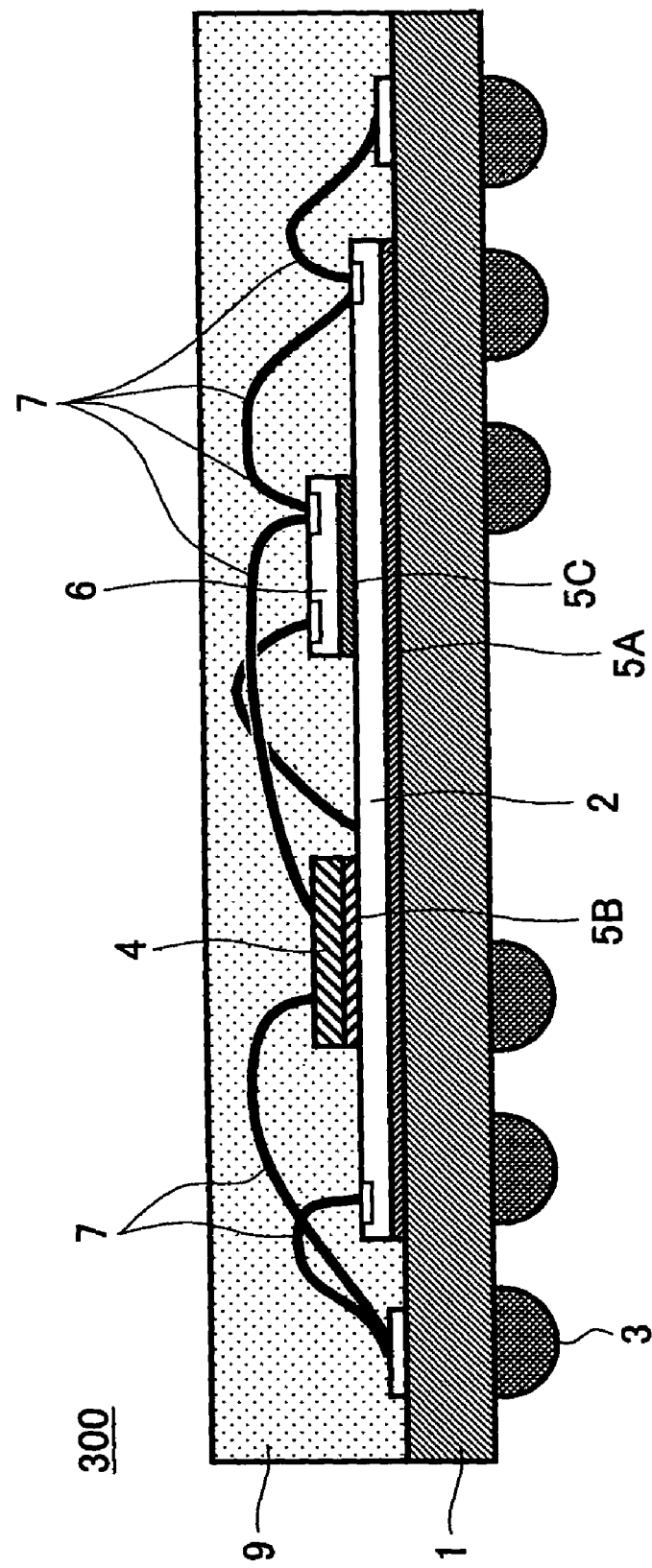
FIG. 40 is a cross-sectional view of a semiconductor device having a relay board of a tenth embodiment of the present invention.
Figure 41:
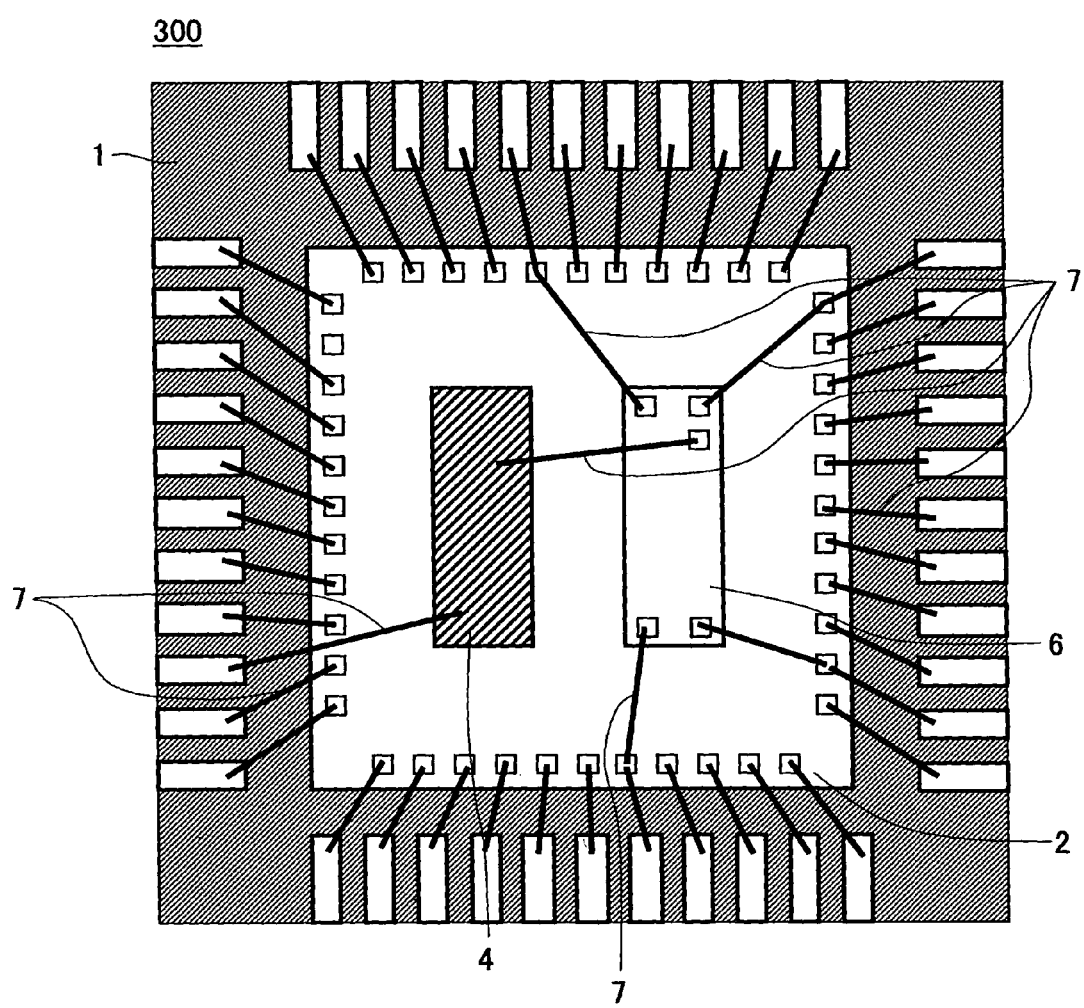
FIG. 41 is a partially expanded view of the semiconductor device shown in FIG. 40.

FIG. 40 is a cross-sectional view of a semiconductor device having a relay board of a tenth embodiment of the present invention. FIG. 41 is a partially expanded view of the semiconductor device shown in FIG. 40. Illustration of the sealing resin 9 shown in FIG. 40 is omitted in FIG. 41.

In the above-discussed first through ninth embodiments, the relay board 4 is provided between the first semiconductor chip 4 and the second semiconductor chip 6.

On the other hand, in the tenth embodiment of the present invention, the second semiconductor chip 6 and the relay board 4 are provided on the first semiconductor chip 2 in parallel with a designated gap.

In other words, referring to FIG. 40 and FIG. 41, the first semiconductor chip 2 is mounted on the wiring board 1 via the adhesive 5A.

The second semiconductor chip 6 whose main surface is smaller than the main surface of the first semiconductor chip 2 is adhered and fixed on the first semiconductor chip 2 via the adhesive 5C. The relay board 4 is adhered and fixed on the first semiconductor chip 2 via the adhesive 5B in parallel with the second semiconductor chip 6 with a designated gap therebetween.

The relay board 4 and the electrode of the first semiconductor chip 2, the relay board 4 and the electrode of the second semiconductor chip 6, the electrode of the first semiconductor chip 2 and the electrode of the second semiconductor chip 6, the electrode of the first semiconductor chip 2 and the electrode of the wiring board 1, the electrode of the second semiconductor chip 6 and the electrode of the wiring board 1, and the relay board 4 and the electrode of the wiring board 1 are respectively connected by the bonding wires 7.

The first semiconductor chip 2, the second semiconductor chip 6, the relay board 4, and the bonding wires 7 are sealed by the sealing resin 9.

Thus, a two-steps structure where the second semiconductor chip 6 and the relay board 4 are provided on the first semiconductor chip 2 is applied in this embodiment. Hence, as compared with a three-steps structure where the relay board 4 is provided between the first semiconductor chip 2 and the second semiconductor chip 6, it is possible to make the semiconductor device 300 thinner.

Of course, in the seventh embodiment, it is possible to achieve the same effect as achieved by the first embodiment of the present invention.

In addition, the internal structure of the relay board 4 may be as shown in FIG. 4, FIG. 6 or FIG. 7. The main surface of the relay board may have the structure shown in FIG. 8 through FIG. 12.

In the meantime, an example where the relay board is provided in a chip stacking type semiconductor device having a structure where the semiconductor chip is stacked on the die pad of the lead frame, and the electrode pad of the semiconductor chip and the inner lead of the lead frame or the electrodes of plural semiconductor chips are connected by the bonding wire, is discussed in the first through fourth embodiments.

However, the relay board may be provided in a chip stacking type semiconductor device having a structure where the semiconductor chip is stacked on the wiring board, and the electrode pad of the semiconductor chip and the bonding pad on the wiring board or the electrodes of plural semiconductor chips are connected by the bonding wires.

An example where the relay board is provided in a chip stacking type semiconductor device having a structure where the semiconductor chip is stacked on the wiring board, and the electrode pad of the semiconductor chip and the bonding pad on the wiring board or the electrodes of plural semiconductor chips are connected by the bonding wire is discussed in the fifth through tenth embodiments.

However, the relay board may be provided in a chip stacking type semiconductor device having a structure where the semiconductor chip is stacked on the die pad of the lead frame, and the electrode pad of the semiconductor chip and the inner lead of the lead frame or the electrodes of plural semiconductor chips are connected by the bonding wires.

2. An Embodiment of a Manufacturing Method of the Semiconductor Device of the Present Invention Next, an embodiment of the manufacturing method of the semiconductor device and the relay board of the present invention is discussed with reference to FIG. 42 through FIG. 45.

FIG. 42 through FIG. 45 are first through fourth views for explaining an embodiment of a manufacturing method of the semiconductor device and the relay board of the present invention.

Figure 42:
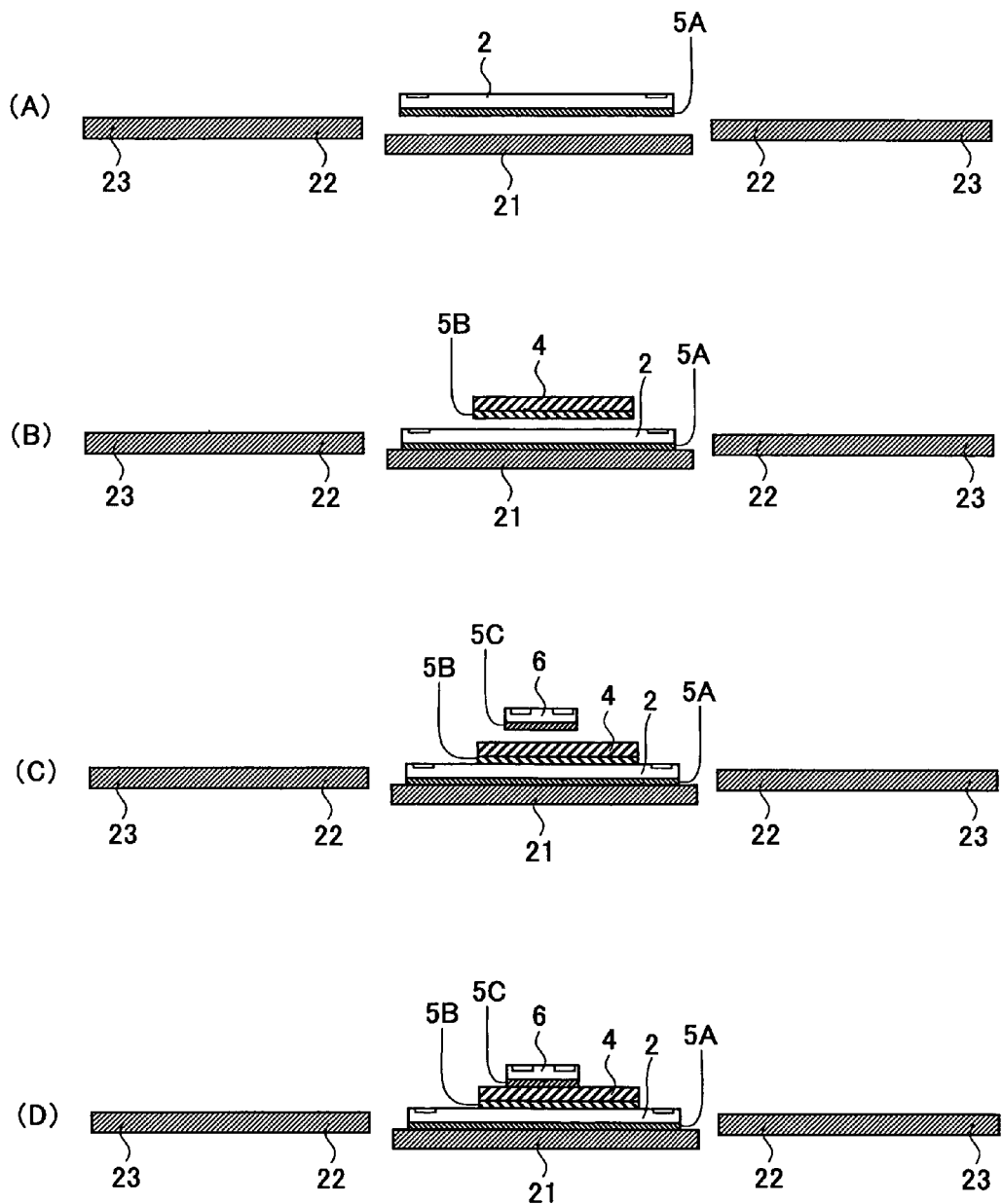
FIG. 42 is a first view for explaining an embodiment of a manufacturing method of the semiconductor device and the relay board of the present invention.

As shown in FIG. 42-(A), the first semiconductor chip 2 is adhered and fixed on the die pad (die stage) of the lead frame via the adhesive 5A.

Next, the relay board 4 is adhered and fixed on the first semiconductor chip 2 via the adhesive 5B as shown in FIG. 42-(B). In this case, in a case where plural relay boards 51*a* and 51*b* are independently adhered and fixed on the first semiconductor chip 2 in parallel with a gap via the common film state adhesive 5D as discussed in the third embodiment of the present invention, a process shown in FIG. 44 is applied.

Figure 44:
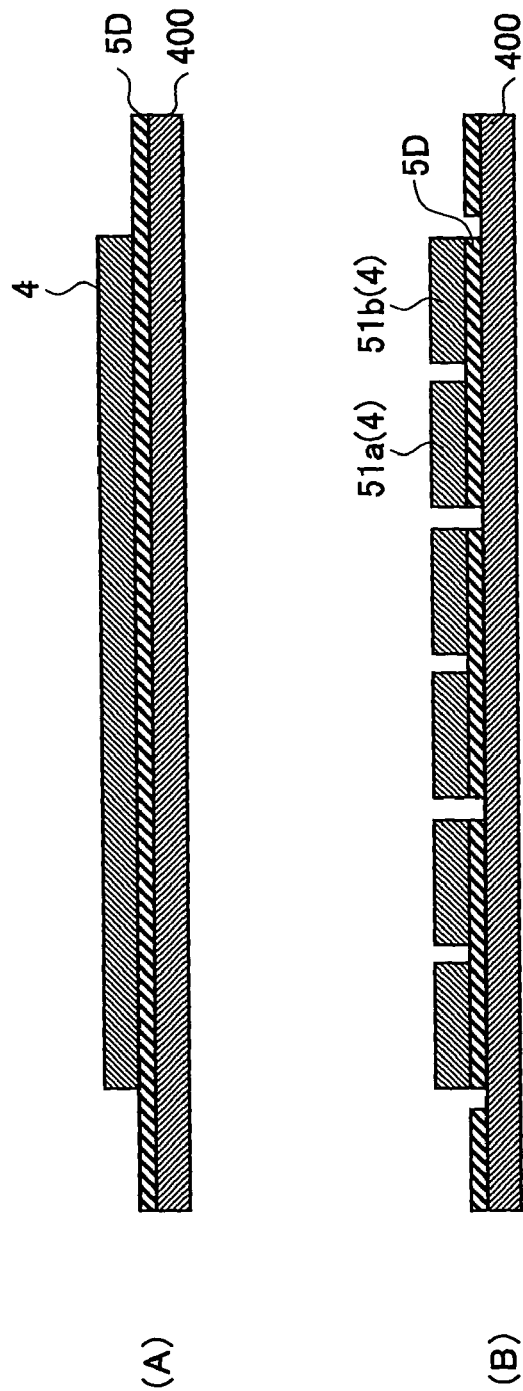
FIG. 44 is a third view for explaining an embodiment of a manufacturing method of the semiconductor device and the relay board of the present invention.

As shown in FIG. 44-(A), the relay board 4 is adhered on a dicing sheet 400 via the film adhesive 5D. This adhering may be done by heating at approximately 50 through 100° C.

Next, as shown in FIG. 44-(B), the relay board 4 and the adhesive 5D are cut by dicing with a blade not shown in FIG. 44-(B). In this case, only the relay board 4 is cut at one part and both the relay board 4 and the adhesive 5D are cut at another part, by making the depth of cut different. In the example shown in FIG. 44-(B), two relay boards 51*a* and 51*b* are adhered on the single adhesive 5D.

Furthermore, in the process shown in FIG. 44-(B), the second embodiment of the present invention wherein each of the relay board 4 is independently adhered on the adhesive 5D can be realized by cutting both the relay board 4 and the adhesive 5D at all of the parts.

In addition, in the process shown in FIG. 44-(B), the fourth embodiment of the present invention wherein the groove 76 is formed in the conductive part 32 and the insulation layer 37 so that a single relay board is divided into two parts can be realized by not completely cutting the relay board 4 but cutting only the conductive part 32 (and the insulation layer 37) of the relay board 4.

Furthermore, as discussed above, the relay board 4 or the like can be cut by dicing with a blade, laser processing, etching process, or the like.

Especially, by laser processing, as shown in FIG. 19 and FIG. 29, the groove 91 can be easily formed in a bending line so that main surfaces (conductive surfaces) of the divided two areas have substantially L-shaped configurations. In addition, by the laser processing, as shown in FIG. 20 and FIG. 30, the groove 96 can be easily formed in a curved line so that main surfaces (conductive surfaces) of the divided two areas have substantially curved parts.

Figure 45:
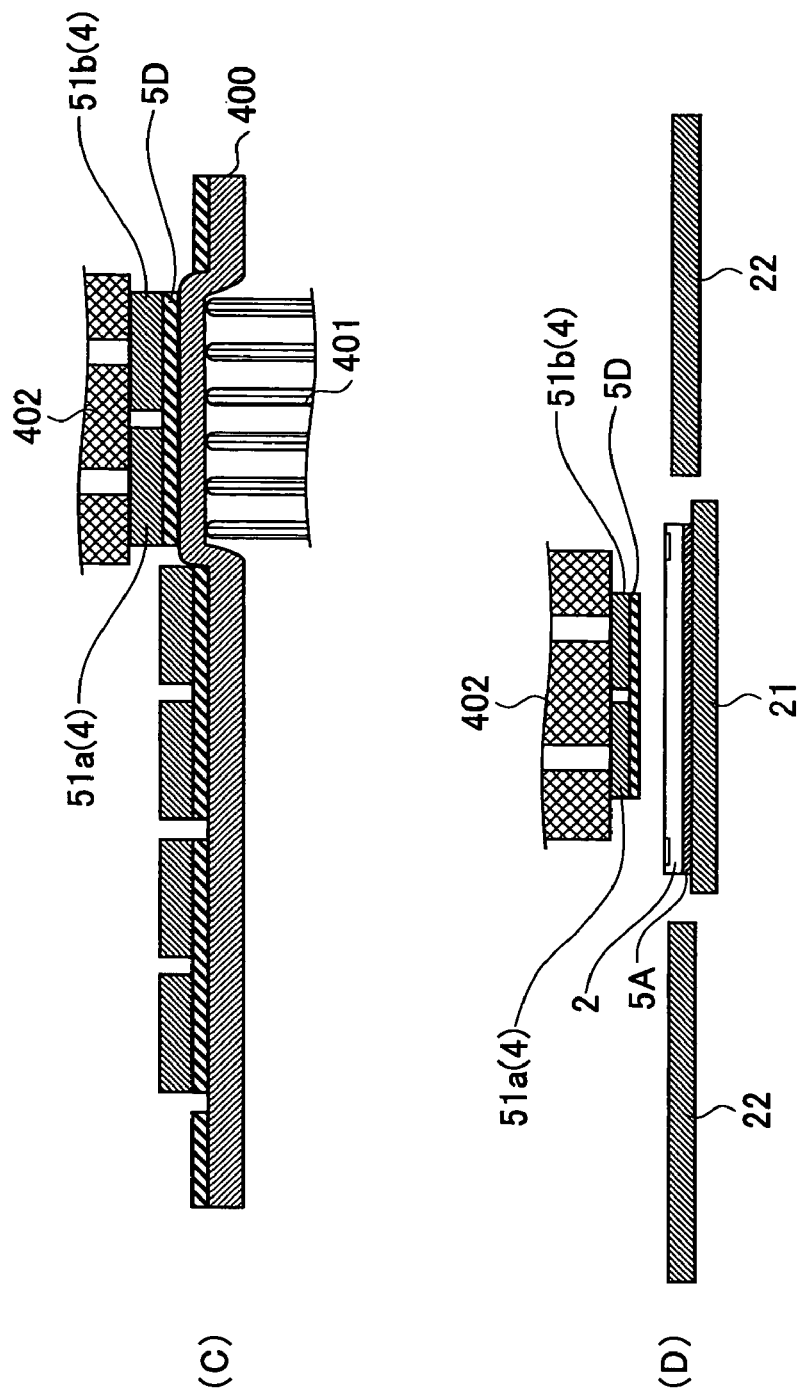
FIG. 45 is a fourth view for explaining an embodiment of a manufacturing method of the semiconductor device and the relay board of the present invention.

Next, as shown in FIG. 45-(C), by using a pushing jig such as a pushing pin 401 or the like, two relay boards 51*a* and 51*b* adhered on the adhesive 5D are pushed up at the same time as a one set so as to be adhered by a bonding tool 402.

Next, as shown in FIG. 45-(D), the relay boards 51*a* and 51*b* are adhered and fixed on a designated part of the first semiconductor chip 4 by pressing. In this case, while a pressing pressure depends on a property such as viscosity, adhesion, or the like of the adhesive 5D, the pressing pressure may be, for example, approximately 0.02 through 0.5 MPa. In addition, the first semiconductor chip 4, the relay boards 51*a* and 51*b*, or both semiconductor chip 4 and the relay boards 51*a* and 51*b* may be heated at, for example, approximately 50 through 200° C.

Next, the adhesive 5C is adhered on the second semiconductor chip 6 as shown in FIG. 42-(C). While a single second semiconductor chip 6 is used in the example shown in the example shown in FIG. 42-(C), plural second semiconductor chips 6 may be provided on the relay board 4 by the process discussed below so that the fifth embodiment of the present invention can be realized.

Next, as shown in FIG. 42-(D), the second semiconductor chip 6 is adhered and fixed on the relay board 4 via the adhesive 5C. In this case, in a case where plural relay boards are provided like the second and third embodiments of the present invention or a single relay board has two divided conductive areas like the fourth embodiment of the present invention, the second semiconductor chip 6 is provided on respective parts of the plural conductive areas.

Figure 43:
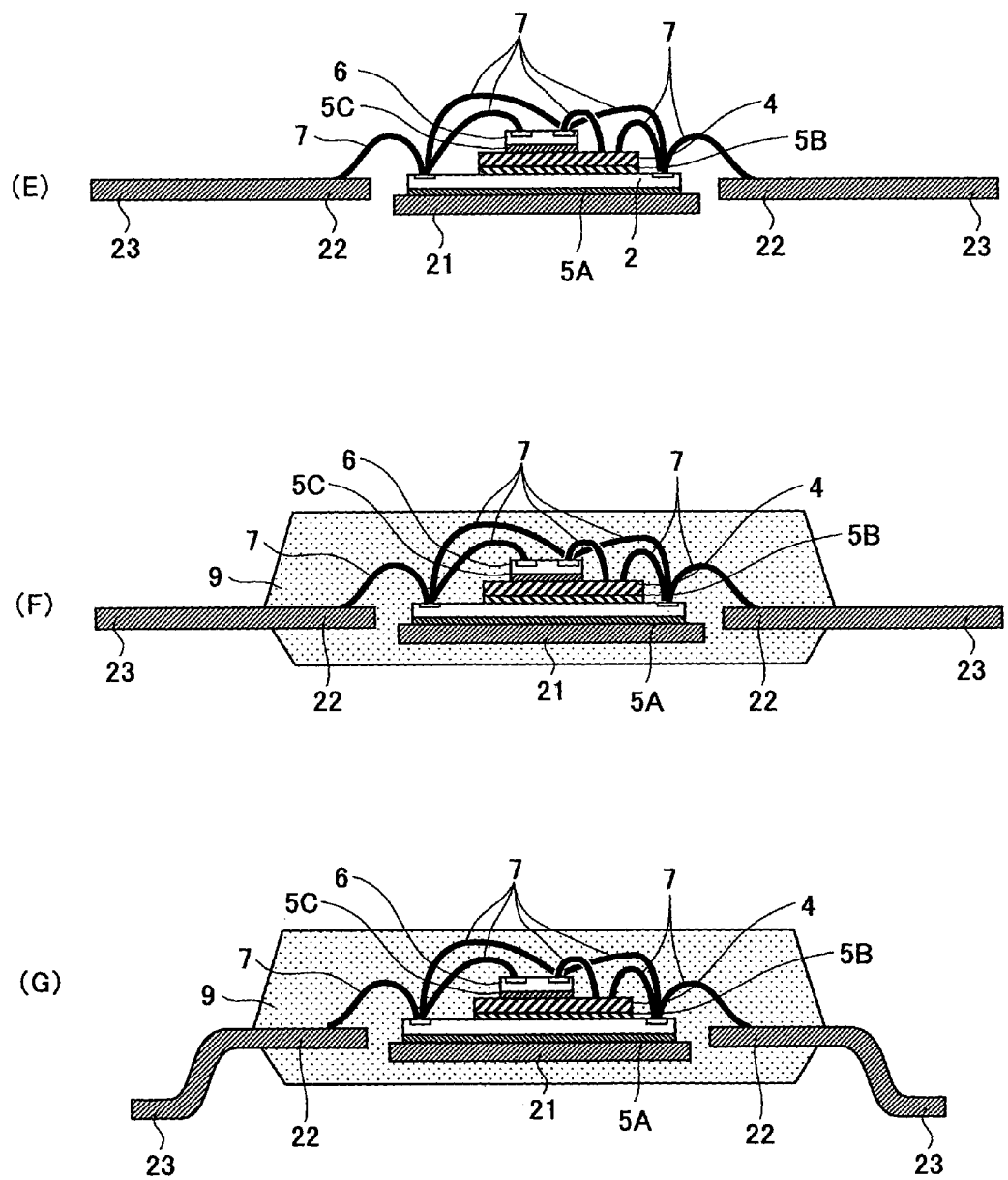
FIG. 43 is a second view for explaining an embodiment of a manufacturing method of the semiconductor device and the relay board of the present invention.

Next, as shown in FIG. 43-(E), the relay board 4 and the electrode of the first semiconductor chip 2, the relay board 4 and the electrode of the second semiconductor chip 6, the electrode of the first semiconductor chip 2 and the electrode of the second semiconductor chip 6, and the electrode of the first semiconductor chip 2 and the inner lead 22 of the lead frame 20 are respectively connected by the bonding wires 7.

Next, as shown in FIG. 43-(F), The first semiconductor chip 2, the second semiconductor chip 6, the relay board 4, the die pad 22 and the inner lead 22 of the lead frame, and the bonding wire 7 are sealed by the sealing resin 9.

Last, the outer lead 23 is cut and bent so that the semiconductor device is completed as shown in FIG. 43-(G).

Thus, according to the embodiment of the manufacturing method of the semiconductor device and the relay board of the present invention, in the processes shown in FIG. 44-(B), FIG. 45-(C) and FIG. 45-(D), plural relay boards or a single relay board having two divided conductive areas can be provided on the first semiconductor chip at the same time. Accordingly, the productivity of the semiconductor device can be improved so that a manufacturing cost of the semiconductor device can be reduced.

In addition, by the process shown in FIG. 44-(B), FIG. 45-(C) and FIG. 45-(D), plural relay boards or a single relay board having two divided conductive areas can be made from a single relay board adhered on a single adhesive. Accordingly, a precision of a relative position of plural relay boards or a single relay board having two divided conductive areas can be improved so that the manufacturing yield rate can be improved.

In the meantime, in the above-discussed example, an embodiment of the manufacturing method of the chip stacking type semiconductor device having a structure where the relay board is provided in a chip stacking type semiconductor device having a structure where the semiconductor chip is stacked on the die pad of the lead frame, and the electrode pad of the semiconductor chip and the inner lead of the lead frame or the electrodes of plural semiconductor chips are connected by the bonding wires.

However, the present invention can be applied to a manufacturing method of a chip stacking type semiconductor device having a structure where the semiconductor chip is stacked on the wiring board, and the electrode pad of the semiconductor chip and the bonding pad on the wiring board or the electrodes of plural semiconductor chips are connected by the bonding wire. In this case, the die pad of the above-discussed lead frame corresponds to the wiring board and the inner lead of the above-discussed lead frame corresponds to the bonding pad at the wiring board.

The present invention is not limited to these embodiments, but variations and modifications may be made without departing from the scope of the present invention.

This patent application is based on Japanese Priority Patent Application No. 2005-354986 filed on Dec. 8, 2005, the entire contents of which are hereby incorporated by reference.

What is claimed is:

1. A semiconductor device, comprising:
a supporting member;
a first semiconductor element;
a second semiconductor element; and
a relay board provided between the first semiconductor element and the second semiconductor element, wherein:
the relay board includes a substrate having a plate-shaped configuration,
an entire main surface of the substrate is made of a conductive material,
a main surface of first semiconductor element is partly covered by the relay board,
a main surface of the substrate included in the relay board is partly covered by the second semiconductor element,
a part of the main surface of the substrate which is not covered by the second semiconductor element and the second semiconductor element are connected by a first bonding wire, and
the part of the main surface of the substrate which is not covered by the second semiconductor element and a part of the main surface of the first semiconductor element which is not covered by the relay board or the supporting member are connected by a second bonding wire.

2. The semiconductor device as claimed in claim 1, wherein the relay board includes a substrate made of the same material as at least one of the first semiconductor element and the second semiconductor element.

3. The semiconductor device as claimed in claim 1, wherein a resin film is formed on the conductive part; the resin film has an opening where the bonding wire can be connected.

4. The semiconductor device as claimed in claim 1, wherein a groove is formed in the conductive part; and the conductive part is divided into plural areas by the groove.

5. The semiconductor device as claimed in claim 1, wherein the second semiconductor element is provided on the relay board; and
a main surface of the relay board is larger than a main surface of the second semiconductor element.

6. The semiconductor device as claimed in claim 5, wherein the relay board is connected to a power supply electrode or a ground electrode of the second semiconductor element.

7. The semiconductor device as claimed in claim 1, wherein a plurality of the relay boards is provided between the first semiconductor chip and the second semiconductor chip; and
the second semiconductor chip is provided on parts of the relay boards.

8. The semiconductor device as claimed in claim 7, wherein the relay boards are fixed on the first semiconductor element via a common single film adhesive.

9. The semiconductor device as claimed in claim 1, wherein a plurality of the second semiconductor elements is provided on the relay board.

10. A semiconductor device, comprising:
a supporting member;
a first semiconductor element;
a second semiconductor element; and
a relay board provided between the first semiconductor element and the second semiconductor element, wherein:
an entire main surface of the relay board is made of conductive material;
the relay board and the second semiconductor element are connected by a first bonding wire, and the relay board and the first semiconductor element or the supporting member are connected by a second bonding wire;
the relay board is formed on the first semiconductor element and the second semiconductor element is formed on the relay board;
a length in a first direction of the relay board is shorter than lengths in the first direction of the first semiconductor element and the second semiconductor element so that an area not overlapping with the relay board is formed at the first semiconductor element; and
a length in a second direction of the relay board is longer than lengths in the second direction of the first semiconductor element and the second semiconductor element so that an area not overlapping with the second semiconductor element is formed at the relay board.

11. A manufacturing method of a semiconductor device having a relay board, the manufacturing method comprising the steps of:
a) adhering a film adhesive to the relay board;
b) cutting only the relay board at a first part and cutting both the relay board and the adhesive adhered to the relay board at a second part, so that plural divided relay boards adhering to the common single film adhesive are formed; and
c) concurrently providing the divided relay boards on a semiconductor element.

12. The manufacturing method of a semiconductor device having a relay board as claimed in claim 11, wherein a conductive part of the relay board is cut in the step of cutting only the relay board.

13. The manufacturing method of a semiconductor device having a relay board as claimed in claim 11, wherein the step of cutting only the relay board is implemented by using a laser process.

14. A semiconductor device, comprising:
a first semiconductor element;
a second semiconductor element; and
a relay board configured to relay connection between the first semiconductor element and the second semiconductor element, and connection between the second semiconductor element and a wiring board or a lead frame;
wherein the relay board is provided between the first semiconductor element and the second semiconductor element;
an entire main surface of the relay board is made of conductive material;
the relay board and the second semiconductor element, and the relay board and the first semiconductor element, the wiring board, or the lead frame, are connected by bonding wires;
the relay board is formed on the first semiconductor element and the second semiconductor element is formed on the relay board;
a length in a first direction of the relay board is shorter than lengths in the first direction of the first semiconductor element and the second semiconductor element so that an area not overlapping with the relay board is formed at the first semiconductor element; and
a length in a second direction of the relay board is longer than lengths in the second direction of the first semiconductor element and the second semiconductor element so that an area not overlapping with the second semiconductor element is formed at the relay board.

* * * * *